(12) United States Patent
Huang et al.

(10) Patent No.: US 9,786,618 B2
(45) Date of Patent: Oct. 10, 2017

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Chang-Pin Huang, Taoyuan County (TW); Hsien-Ming Tu, Hsinchu County (TW); Ching-Jung Yang, Taoyuan County (TW); Shih-Wei Liang, Taichung County (TW); Hung-Yi Kuo, Taipei (TW); Yu-Chia Lai, Miaoli County (TW); Hao-Yi Tsai, Hsinchu (TW); Chung-Shi Liu, Hsinchu (TW); Chen-Hua Yu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/942,961

(22) Filed: Nov. 16, 2015

(65) Prior Publication Data
US 2017/0141056 A1 May 18, 2017

(51) Int. Cl.
*H01L 23/48* (2006.01)
*H01L 23/00* (2006.01)
*H01L 23/522* (2006.01)
*H01L 23/532* (2006.01)

(52) U.S. Cl.
CPC .......... *H01L 24/05* (2013.01); *H01L 23/5226* (2013.01); *H01L 23/53228* (2013.01); *H01L 24/02* (2013.01); *H01L 24/13* (2013.01); *H01L 24/14* (2013.01); *H01L 2224/02372* (2013.01); *H01L 2224/0401* (2013.01); *H01L 2224/05015* (2013.01); *H01L 2224/05024* (2013.01); *H01L 2224/05147* (2013.01); *H01L 2224/13026* (2013.01); *H01L 2224/1413* (2013.01); *H01L 2924/35121* (2013.01)

(58) Field of Classification Search
CPC ............. H01L 21/568; H01L 23/49838; H01L 21/67121; H01L 23/3114
See application file for complete search history.

(56) References Cited

U.S. PATENT DOCUMENTS

2013/0320553 A1* 12/2013 Kuo ...................... H01L 23/528
257/774

* cited by examiner

*Primary Examiner* — Elias M Ullah
(74) *Attorney, Agent, or Firm* — WPAT, P.C., Intelllectual Property Attorneys; Anthony King

(57) ABSTRACT

A semiconductor structure includes a die including a die pad disposed over the die; a conductive member disposed over and electrically connected with the die pad; a molding surrounding the die and the conductive member; and a redistribution layer (RDL) disposed over the molding, the conductive member and the die, and including a dielectric layer and an interconnect structure, wherein the interconnect structure includes a land portion and a plurality of via portions, the land portion is disposed over the dielectric layer, the plurality of via portions are protruded from the land portion to the conductive member through the dielectric layer, and each of the plurality of via portions at least partially contacts with the conductive member.

20 Claims, 18 Drawing Sheets

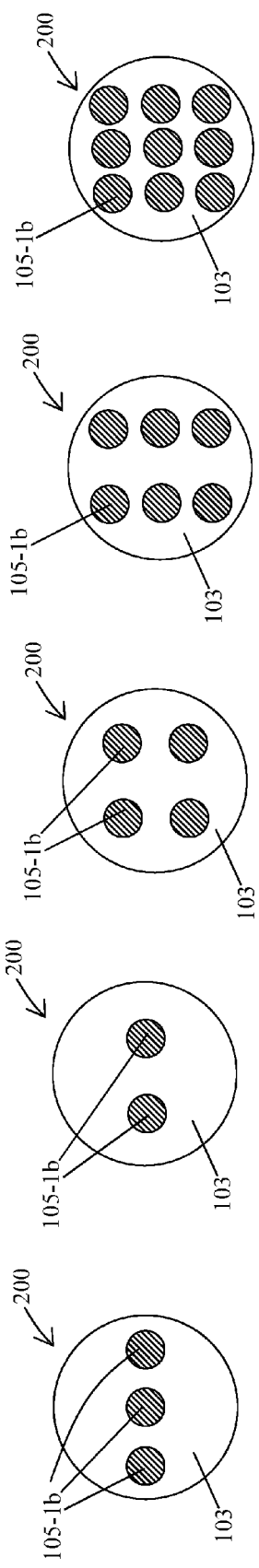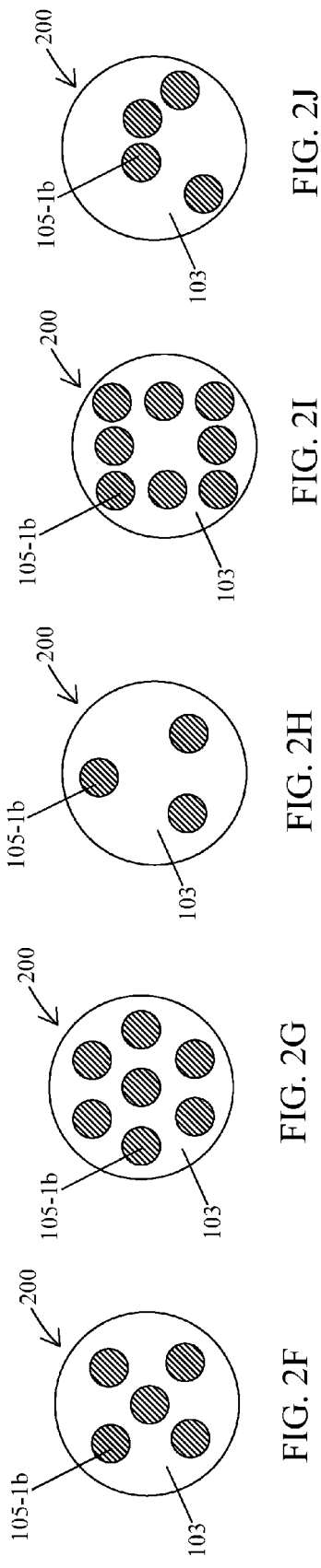

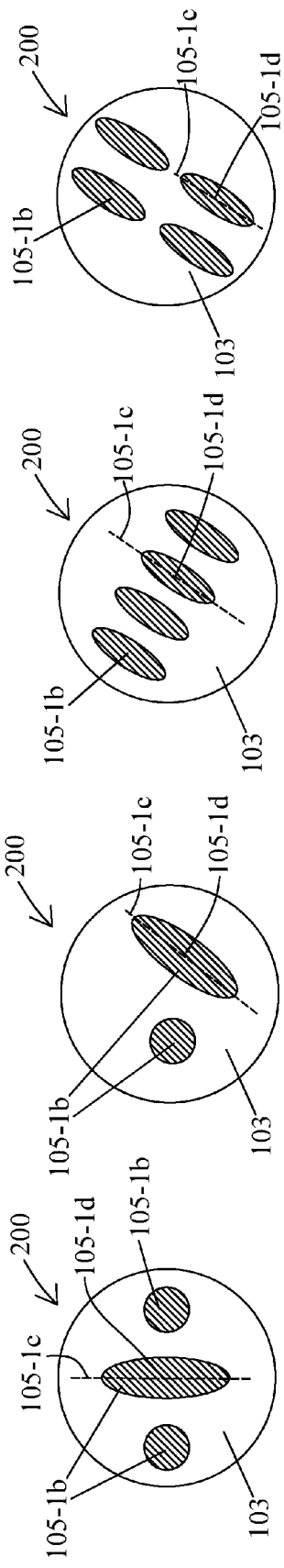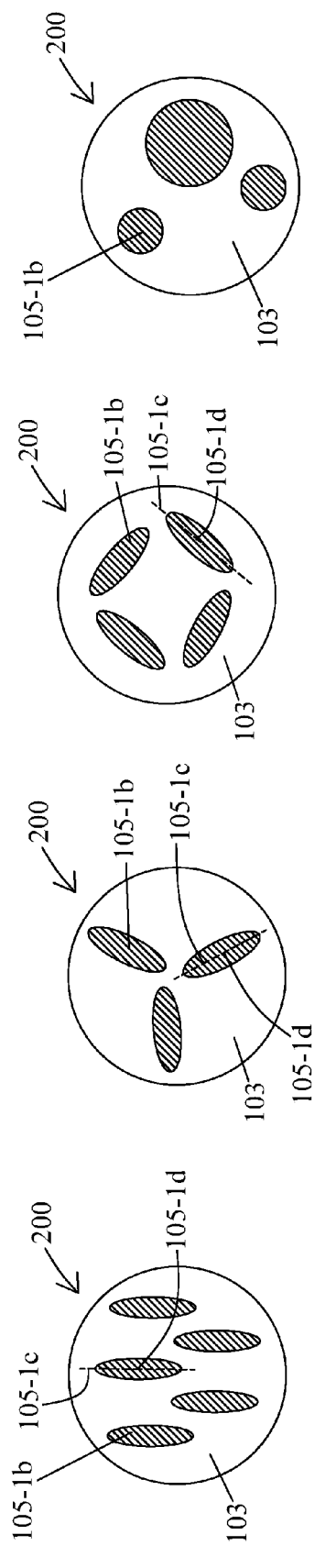

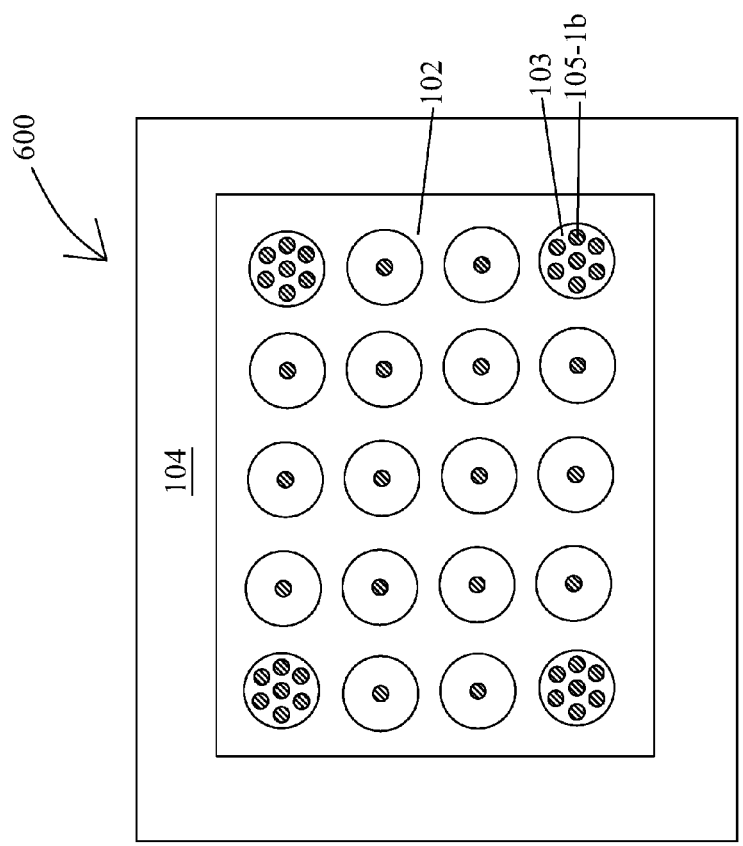
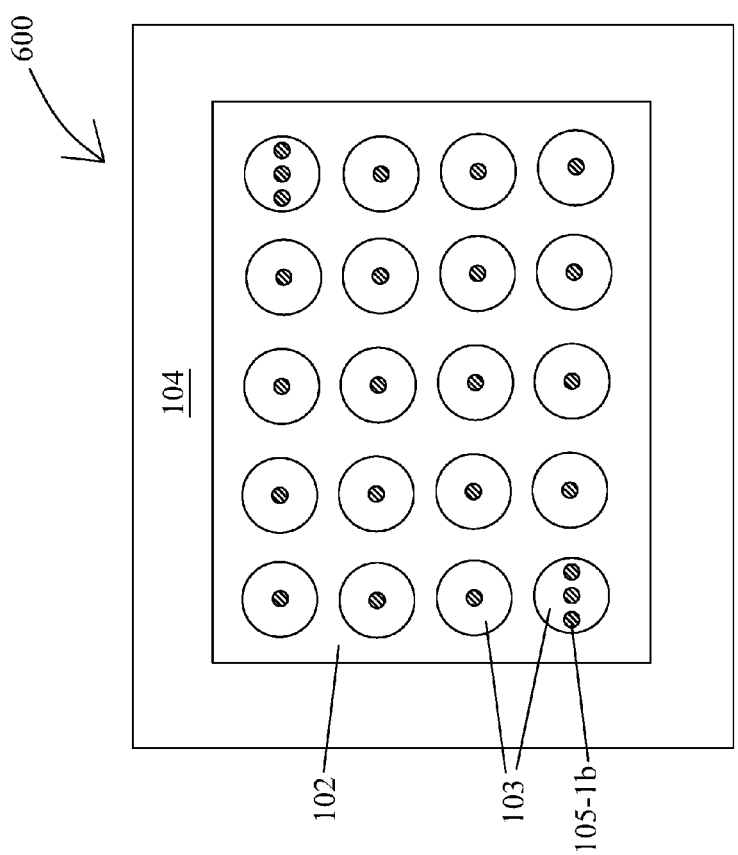
FIG. 6B
FIG. 6A

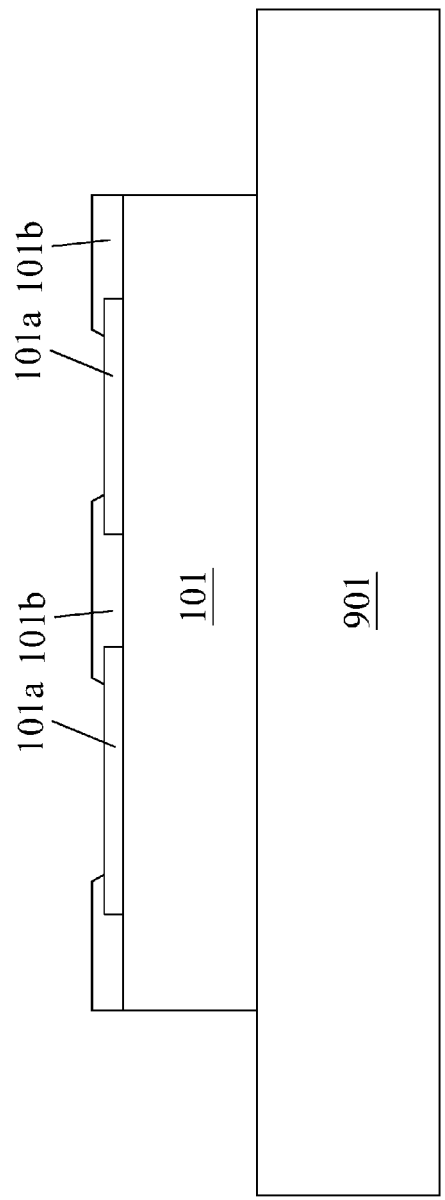
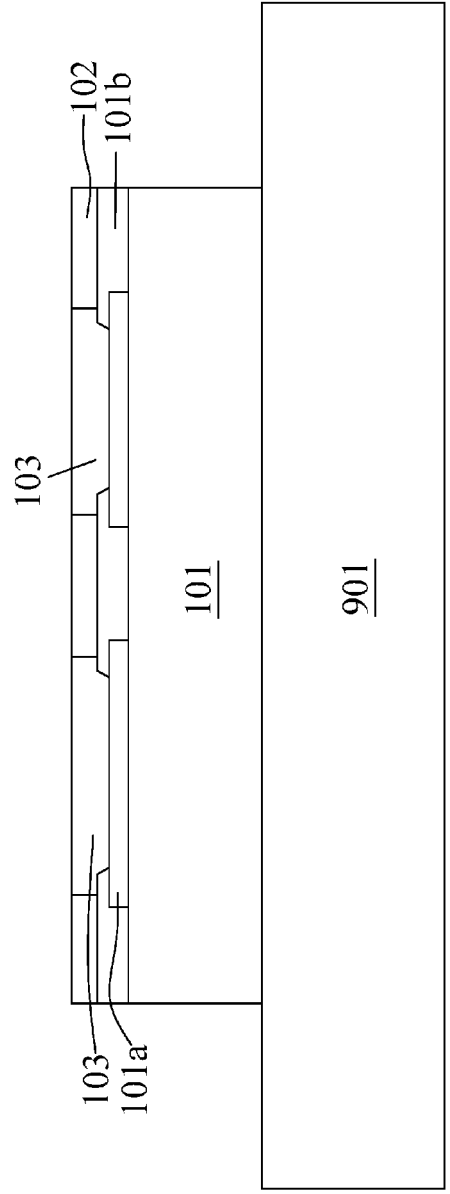

SEMICONDUCTOR STRUCTURE AND MANUFACTURING METHOD THEREOF

BACKGROUND

Electronic equipment using semiconductor devices are essential for many modern applications. With the advancement of electronic technology, semiconductor devices are becoming increasingly smaller in size while having greater functionality and greater amounts of integrated circuitry. Due to the miniaturized scale of the semiconductor device, wafer level packaging (WLP) is widely used because of its low cost and relatively simple manufacturing operations. During the WLP operation, a number of semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor electrical interconnection, development of cracks, delamination of components, inaccurate placement of components or other issues, which results in a high yield loss of the semiconductor device. The semiconductor device is produced in an undesired configuration, which further wastes materials and thus increases the manufacturing cost. As such, there are many challenges for modifying a structure of the semiconductor devices and improving the manufacturing operations.

The semiconductor device is assembled with a number of integrated components including various materials with differences in thermal properties. Since many various components with different materials are involved, a complexity of the manufacturing operations of the semiconductor device is increased. As such, there is a continuous need to improve the manufacturing of the semiconductor devices and solve the above deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A-2R are enlarged top views of a part 200 of a semiconductor structure of FIG. 1 with via portions of a first interconnect structure in various shapes, patterns or dimensions in accordance with some embodiments of the present disclosure.

FIGS. 6A-6B are enlarged top views of a part 600 of a semiconductor structure of FIG. 3 with via portions of a first interconnect structure in various shapes, patterns or dimensions in accordance with some embodiments of the present disclosure.

FIGS. 10A-10H are schematic views of manufacturing a semiconductor structure by a method of FIG. 9 in accordance with some embodiments of the present disclosure.

DETAILED DESCRIPTION OF THE DISCLOSURE

Figure 1:
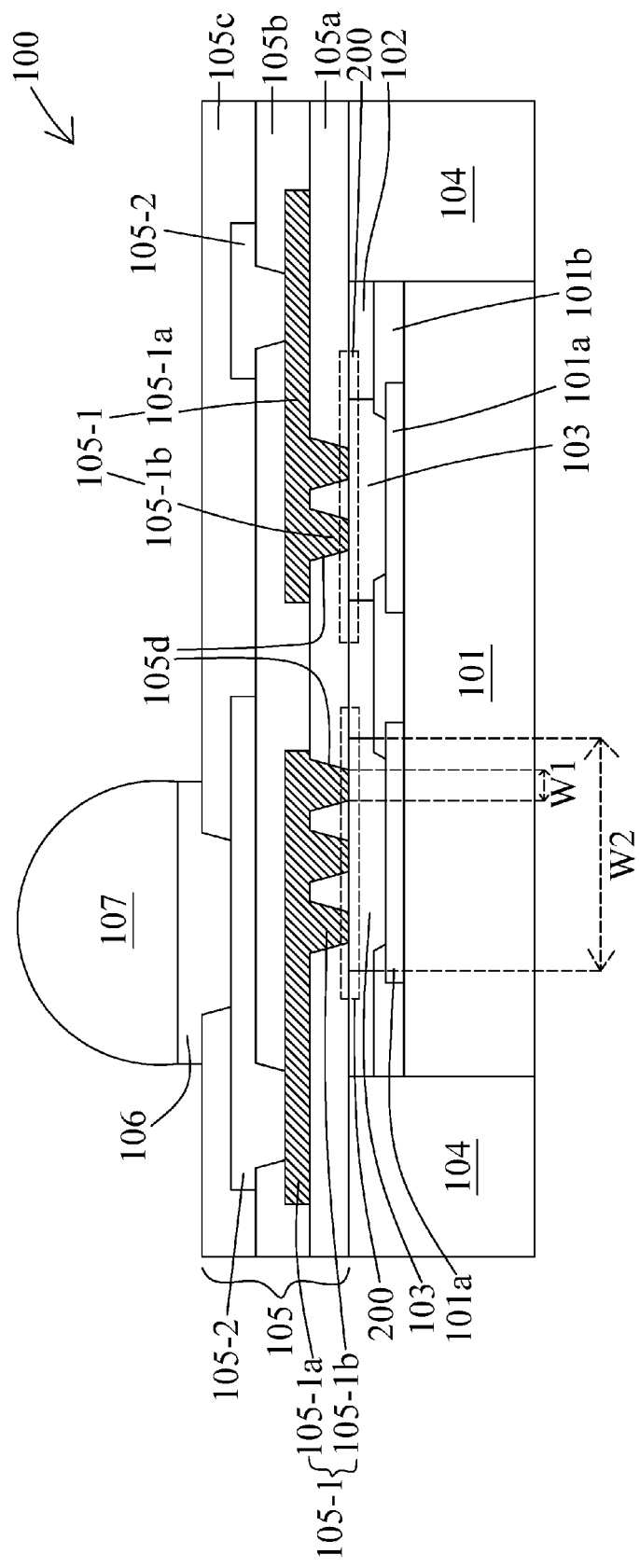
FIG. 1 is a schematic cross-sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A die is fabricated and singulated from a semiconductive wafer. After singulation, the die is packaged to become a semiconductor package and integrated with another die or package. The die is encapsulated by a molding, and I/O terminals of the die are routed out through conductive lines or other conductive structures. Several isolation layers are disposed over the die and the molding, and the conductive lines route out the I/O terminals within the isolation layers. Such configuration of the semiconductor package involves different kinds of materials (e.g. the die, the molding, the isolation layers, the conductive structures, etc.) with different thermal properties (e.g. different coefficient of thermal expansion (CTE), etc.). An internal stress would be easily developed between materials during subsequent thermal processes such as heat treatment, reflowing, etc.

Such a mismatch of CTE would cause cracks developed within the semiconductor package. The cracks can even propagate through the semiconductor package during subsequent manufacturing operations. The propagation of the cracks would further weaken configuration of the semiconductor package and the electrical connection between the die and the conductive lines, and ultimately results in poor reliability or failure of the semiconductor package.

In the present disclosure, an improved semiconductor structure is disclosed. The semiconductor structure includes a conductive member disposed over and electrically connected with a die, and a redistribution layer (RDL) disposed over the conductive member. The RDL includes an interconnect structure electrically connected with the conductive member. The interconnect structure includes several via portions contacting with the conductive member. The interconnect structure is electrically connected with the conductive member by more than one via portion. Such configuration can increase contact surface area between the interconnect structure and the conductive member, and thus can improve their electrical connection and minimize or prevent delamination of the interconnect structure from the conductive member.

Furthermore, the conductive member (for example, disposed at a corner of the semiconductor structure, etc.) would suffer an internal stress after thermal processes, and would cause delamination of the interconnect structure from the conductive member. A formation of several via portions on the conductive member can reduce the internal stress and thus minimize or prevent a development of cracks between the interconnect structure, the conductive member and the dielectric layer. A reliability or performance of the semiconductor structure is improved.

FIG. 1 is a schematic cross-sectional view of a semiconductor structure 100 in accordance with various embodiments of the present disclosure. In some embodiments, the semiconductor structure 100 includes a die 101, a conductive member 103, a molding 104 and a redistribution layer (RDL) 105. In some embodiments, the semiconductor structure 100 is a semiconductor package. In some embodiments, the semiconductor structure 100 is an integrated fan out (InFO) package in which I/O terminals of the die 101 are fanned out and redistributed over a surface of the die 101 in a greater area.

In some embodiments, the die 101 is a piece including semiconductive materials such as silicon, and is fabricated with a predetermined functional circuit within the die 101 produced by photolithography operations. In some embodiments, the die 101 is singulated from a semiconductive wafer by a mechanical or laser blade. In some embodiments, the die 101 comprises a variety of electrical circuits suitable for a particular application. In some embodiments, the electrical circuits include various devices such as transistors, capacitors, resistors, diodes and/or the like. In some embodiments, the die 101 comprises any one of various known types of semiconductor devices such as memories (such as SRAMS, flash memories, etc.), microprocessors, application-specific integrated circuits (ASICs), digital signal processors (DSPs), or the like. In some embodiments, the die 101 is a logic device die, central computing unit (CPU) die, transceiver die, or the like.

In some embodiments, the die 101 has a cross-section in a quadrilateral, a rectangular or a square shape. FIG. 1 illustrates that the semiconductor structure 100 includes one die; however, it is understood that the semiconductor structure 100 can include more than one die. It is not intended to limit a number of dies in the semiconductor structure 100.

In some embodiments, a die pad 101a is disposed over a surface of the die 101 or within the die 101. In some embodiments, the die pad 101a is disposed over an active side of the die 101. For clarity and simplicity, FIG. 1 illustrates only two die pads 101a over the die 101; however, a person of ordinary skill in the art would readily understand that one or more die pads 101a can be present over the die 101. In some embodiments, the die 101 includes several die pads 101a thereon or therein.

In some embodiments, the die pad 101a is electrically connected with a circuitry external to the die 101 so that a circuitry internal to the die 101 electrically connects with the circuitry external to the die 101 through the die pad 101a. In some embodiments, the die pad 101a is configured to electrically couple with a conductive trace or a conductive structure so that the circuitry internal to the die 101 can electrically connect with the circuitry external to the die 101 from the die pad 101a through the conductive trace. In some embodiments, the die pad 101a includes gold, silver, copper, nickel, tungsten, aluminum, palladium and/or alloys thereof.

In some embodiments, a passivation 101b is disposed over the die pad 101a and the surface of the die 101. In some embodiments, the passivation 101b is patterned such that a portion of the die pad 101a is exposed from the passivation 101b in order to allow an electrical connection with the circuitry external to the die 101. In some embodiments, the passivation 101b partially covers a top surface of the die pad 101a. The passivation 101b is configured to provide an electrical insulation and a moisture protection for the die 101 so that the die 101 is isolated from ambient environment.

In some embodiments, the passivation 101b includes dielectric material such as silicon oxide, silicon carbide, silicon oxynitride, silicon nitride or the like. In some embodiments, the passivation 101b includes dielectric material such as polymer, polybenzoxazole (PBO), polyimide, benzocyclobutene (BCB), or the like. In some embodiments, the passivation 101b is a single layer or more than one layer of dielectric materials disposed over each other.

In some embodiments, a first dielectric layer 102 is disposed over the die 101. In some embodiments, the first dielectric layer 102 is patterned such that a portion of the die pad 101a is exposed from the first dielectric layer 102 in order to allow an electrical connection with the circuitry external to the die 101. In some embodiments, the first dielectric layer 102 includes dielectric material such as silicon oxide, silicon carbide, silicon oxynitride, silicon nitride or the like. In some embodiments, the first dielectric layer 102 includes dielectric material such as polymer, polybenzoxazole (PBO), polyimide, benzocyclobutene (BCB), or the like. In some embodiments, the first dielectric layer 102 includes the same or a different material from the passivation 101b. In some embodiments, the first dielectric layer 102 and the passivation 101b are integrally formed.

In some embodiments, the conductive member 103 is disposed over the die pad 101a and surrounded by the passivation 101b or the first dielectric layer 102. For clarity and simplicity, FIG. 1 illustrates only two conductive members 103 disposed over the die pads 101a respectively; however, a person of ordinary skill in the art would readily understand that more conductive members 103 can be present over the die 101 or the die pad 101a. In some embodiments, the conductive member 103 is disposed over the exposed portion of the die pad 101a and electrically connected with the circuitry of the die 101 through the die pad 101a. In some embodiments, the conductive member 103 is configured to electrically connect with another conductive structure.

In some embodiments, the conductive member 103 is surrounded by the passivation 101b or the first dielectric layer 102. In some embodiments, the conductive member 103 is extended through the passivation 101b or the first dielectric layer 102. In some embodiments, a portion of the conductive member 103 is disposed over the first dielectric layer 102. In some embodiments, the conductive member 103 is a conductive pillar. In some embodiments, the conductive member 103 includes metal such as copper, gold, aluminum, etc. In some embodiments, a cross-section of the conductive member 103 is in various shapes such as a circular shape, quadrilateral shape or polygonal shape. In some embodiments, a cross-section of the conductive member 103 surrounded by the first dielectric layer 102 is in a circular shape.

In some embodiments, the molding 104 surrounds the die 101. In some embodiments, the molding 104 surrounds the die pad 101a, the passivation 101b, the first dielectric layer 102 and the conductive member 103. In some embodiments, the molding 104 is disposed adjacent to the die 101. In some embodiments, a surface of the molding 104 is substantially at the same level as a surface of the first dielectric layer 102 and a surface of the conductive member 103. In some embodiments, the molding 104 can be a single layer film or a composite stack. In some embodiments, the molding 104 includes various materials, such as molding compound, molding underfill, epoxy, resin, or the like. In some embodiments, the molding 104 has a high thermal conductivity, a low moisture absorption rate and a high flexural strength. In some embodiments, the molding 104 has a thickness of about 100 um to about 500 um.

In some embodiments, the RDL 105 disposed over the die 101, the conductive member 103 and the molding 104. In some embodiments, the RDL 105 re-routes a path from the die pad 101a so as to redistribute I/O terminals of the die 101 over the molding 104. In some embodiments, the RDL 105 includes several dielectric layers (105a, 105b or 105c) and several interconnect structures (105-1 or 105-2) surrounded by the dielectric layers (105a, 105b or 105c). In some embodiments, the RDL 105 is a post passivation interconnection (PPI).

In some embodiments, the RDL 105 includes a second dielectric layer 105a and a first interconnect structure 105-1 partially surrounded by the second dielectric layer 105a. In some embodiments, the second dielectric layer 105a is disposed over the die 101, the conductive member 103 and the molding 104. In some embodiments, the second dielectric layer 105a includes dielectric material such as silicon oxide, silicon nitride, silicon carbide, silicon oxynitride, polymer, polybenzoxazole (PBO), polyimide, benzocyclobutene (BCB), or the like. In some embodiments, the second dielectric layer 105a includes the same or a different material from the first dielectric layer 102.

In some embodiments, the second dielectric layer 105a includes a recess 105d disposed over the conductive member 103 and extended through the second dielectric layer 105a to expose a portion of a surface of the conductive member 103. For clarity and simplicity, FIG. 1 illustrates only five recesses 105d; however, a person of ordinary skill in the art would readily understand that more than one recess 105d can be present in the semiconductor structure 100.

In some embodiments, the first interconnect structure 105-1 is disposed over the second dielectric layer 105a, the molding 104, the conductive member 103 and the die 101.

In some embodiments, the first interconnect structure 105-1 is configured to electrically connect the circuitry of the die 101 with a circuitry external to the die 101 through the die pad 101a or the conductive member 103. In some embodiments, the first interconnect structure 105-1 includes conductive material such as gold, silver, copper, nickel, tungsten, aluminum, palladium and/or alloys thereof.

In some embodiments, the first interconnect structure 105-1 includes a land portion 105-1a and several via portions 105-1b. In some embodiments, the land portion 105-1a is disposed over the second dielectric layer 105a. In some embodiments, the land portion 105-1a is extended along a surface of the second dielectric layer 105a. In some embodiments, the land portion 105-1a is configured to receive other conductive structure. In some embodiments, the land portion 105-1a is configured to electrically connect with other conductive structure.

In some embodiments, the via portions 105-1b are protruded from the land portion 105-1a to the conductive member 103 through the second dielectric layer 105a. In some embodiments, the via portions 105-1b are disposed over the corresponding conductive member 103. In some embodiments, the via portions 105-1b are disposed on and interfaced with the corresponding conductive member 103. For example, as shown in FIG. 1, the via portions 105-1b are disposed on one of the conductive members 103 correspondingly, where in particular, three via portions 105-1b are disposed on the corresponding conductive member 103 on a left side of the semiconductor structure 100 and two via portions 105-1b are disposed on another corresponding conductive member 103 on a right side of the semiconductor structure 100. In some embodiments, several via portions 105-1b are disposed on one conductive member 103. For clarity and simplicity, FIG. 1 illustrates only five via portions 105-1b; however, a person of ordinary skill in the art would readily understand that several via portions 105-1b can be present over the conductive members 103.

In some embodiments, a number of the via portions 105-1b disposed on one conductive member 103 is from about 2 to about 20. Since more than one via portion 101-5-1b is contacted with the conductive member 103, a delamination of the via portion from the conductive member 103 or the second dielectric layer 105a can be minimized or prevented.

In some embodiments, each of the via portions 105-1b is extended through the second dielectric layer 105a. In some embodiments, each of the via portions 105-1b is vertically extended from the land portion 105-1a. In some embodiments, the land portion 105-1a is electrically connected with the die pad 101a or the conductive member 103 through the via portions 105-1b. In some embodiments, each of the via portions 105-1b at least partially contacts with the corresponding conductive member 103. In some embodiments, all of the via portions 105-1b are disposed inside a surface of the corresponding conductive member 103 contacting with the via portions 105-1b.

In some embodiments, some of the via portions 105-1b do not contact with and are disposed outside of the surface of the corresponding conductive member 103 contacting with the rest of the via portions 105-1b. In some embodiments, a portion of one of the via portions 105-1b does not contact with and is disposed outside of the surface of the corresponding conductive member 103 contacting with remaining portion of the one of the via portions 105-1b.

In some embodiments, a cross-section of each of the via portions 105-1b interfacing with the conductive member 103 can be in various shapes such as a circular, oval, elliptical, quadrilateral or polygonal shape. In some embodiments, a surface of the via portion 105-1b contacting with the conductive member 103 can be in various shapes such as a circular, oval, elliptical, quadrilateral or polygonal shape.

In some embodiments, the surface of the via portion 105-1b contacting with the corresponding conductive member 103 has a width W1 which is a longest length of the surface of the via portion 105-1b. In some embodiments, the width W1 is about 10 um. In some embodiments, the width W1 is less than 20 um. In some embodiments, the width W1 is from about 3 um to about 15 um. In some embodiments, a surface of the conductive member 103 contacting with the corresponding via portions 105-1b has a width W2 which is a longest length of the surface of the conductive member 103. In some embodiments, the width W2 is about 90 um. In some embodiments, the width W2 is from about 50 um to about 150 um.

In some embodiments, there is a ratio of a total surface area of the via portions 105-1b contacting with the corresponding conductive member 103 to a surface area of the conductive member 103 contacting with the corresponding via portions 105-1b. In some embodiments, the total surface area of the via portions is a sum of an area of each via portion 105-1b contacting with the corresponding conductive member 103. In some embodiments, the surface area of the conductive member 103 is an area of a surface of the conductive member 103 where the via portions 105-1b are disposed thereon. For example, as shown in FIG. 1, there is a ratio of the total surface area of three via portions 105-1b to the surface area of the conductive member 103 on the left side of the semiconductor structure 100. In some embodiments, the ratio is substantially greater than about 1:40. In some embodiments, the ratio is from about 1:60 to about 1:1.5. Since more than one via portion 105-1b is contacted with the conductive member 103, a contact surface area between the via portions 105-1b and the corresponding conductive member 103 is increased, and thus delamination of the via portion 105-1b from the corresponding conductive member 103 can be minimized or prevented.

In some embodiments, the RDL 105 includes a third dielectric layer 105b and a second interconnect structure 105-2 disposed over or partially within the third dielectric layer 105b. In some embodiments, the third dielectric layer 105b is disposed over the second dielectric layer 105a and covers the land portion 105-1a of the first interconnect structure 105-1. In some embodiments, a portion of the land portion 105-1a of the first interconnect structure 105-1 is exposed from the third dielectric layer 105b and configured to receive another conductive structure. In some embodiments, the third dielectric layer 105b includes dielectric material such as silicon oxide, silicon nitride, silicon carbide, silicon oxynitride, polymer, polybenzoxazole (PBO), polyimide, benzocyclobutene (BCB), or the like. In some embodiments, the third dielectric layer 105b includes the same or a different material from the first dielectric layer 102 or the second dielectric layer 105a.

In some embodiments, the second interconnect structure 105-2 is electrically connected with the first interconnect structure 105-1. In some embodiments, the second interconnect structure 105-2 at least partially overlies the via portions 105-1b of the first interconnect structure 105-1. In some embodiments, a portion of the second interconnect structure 105-2 is disposed along the third dielectric layer 105b, and a portion of the second interconnect structure 105-2 is extended through the third dielectric layer 105b towards the land portion 105-1a of the first interconnect structure 105-1. In some embodiments, the second interconnect structure 105-2 includes conductive material such as gold, silver, copper, nickel, tungsten, aluminum, palladium and/or alloys thereof.

In some embodiments, the RDL 105 includes a fourth dielectric layer 105c disposed over the third dielectric layer 105b. In some embodiments, the fourth dielectric layer 105c covers the second interconnect structure 105-2. In some embodiments, a portion of the second interconnect structure 105-2 is exposed from the fourth dielectric layer 105b and configured to receive another conductive structure. In some embodiments, the fourth dielectric layer 105c includes dielectric material such as silicon oxide, silicon nitride, silicon carbide, silicon oxynitride, polymer, polybenzoxazole (PBO), polyimide, benzocyclobutene (BCB), or the like. In some embodiments, the fourth dielectric layer 105c includes the same or a different material from the first dielectric layer 102, the second dielectric layer 105a or the third dielectric layer 105b.

In some embodiments, a conductive pad 106 is disposed over the RDL 105 and configured to receive a conductive bump 107. In some embodiments, the conductive pad 106 is disposed over the portion of the second interconnect structure 105-2 exposed from the fourth dielectric layer 105b. In some embodiments, a portion of the conductive pad 106 is disposed over the fourth dielectric layer 105c, and a portion of the conductive pad 106 is extended through the fourth dielectric layer 105c towards the second interconnect structure 105-2. In some embodiments, the conductive pad 106 is an under bump metallization (UBM) pad including a solderable surface. In some embodiments, the conductive pad 106 includes gold, silver, copper, nickel, tungsten, aluminum, palladium and/or alloys thereof.

In some embodiments, the conductive bump 107 is disposed over and electrically connected with the conductive pad 106. In some embodiments, the conductive bump 107 includes conductive material such as solder, copper, nickel, gold or other conductive material. In some embodiments, the conductive bump 107 is a solder ball, a ball grid array (BGA) ball, a controlled collapse chip connection (C4) bump, a microbump, a pillar or the like.

FIGS. 2A-2J illustrate schematic enlarged top views of a part 200 of the semiconductor structure 100 in FIG. 1. FIGS. 2A-2J show cross-sections of the via portions 105-1b of the first interconnect structure 105-1 and a cross-section of the corresponding conductive member 103 interfacing with the via portions 105-1b in the part 200. In some embodiments, the via portions 105-1b disposed on the corresponding conductive member 103 are arranged in a predetermined pattern. For example, the via portions 105-1b can be arranged in various patterns as illustrated in any one of FIGS. 2A-2J.

In some embodiments, the via portions 105-1b are disposed on the corresponding conductive member 103 and aligned in a line, as shown in FIG. 2A or 2B. In some embodiments, the via portions 105-1b are arranged in a regular array on the corresponding conductive member 103 as shown in any one of FIGS. 2C-2E. In some embodiments, the via portions 105-1b are arranged in a specific pattern on the corresponding conductive member 103, as shown in any one of FIGS. 2F-2I. In some embodiments, the via portions 105-1b are randomly arranged on the corresponding conductive member 103, as shown in FIG. 2J FIGS. 2K-2R illustrate schematic enlarged top views of the part 200 of the semiconductor structure 100 in FIG. 1. FIGS. 2K-2R show cross-sections of the via portions 105-1b of the first interconnect structure 105-1 and the cross-section of the corresponding conductive member 103 interfacing the via portions 105-1b in the part 200. In some embodiments, the via portions 105-1b are disposed inside the cross-section of the conductive member 103 contacting with the via portions 105-1b. In some embodiments, the cross-sections of the via portions 105-1b disposed on the corresponding conductive member 103 are in various shapes or dimensions as illustrated in any one of FIGS. 2K-2R. In some embodiments, the cross-sections of the via portions 105-1b are in the same shapes as or different shapes from each other. In some embodiments, the cross-sections of the via portions 105-1b are in the same dimensions as or different dimensions from each other, for example as shown in FIG. 2R.

In some embodiments, as shown in FIGS. 2K and 2L, cross-sections of the via portions 105-1b are in different shapes from each other. In some embodiments, some of the cross-sections of the via portions 105-1b are in a circular shape, while some of the cross-sections of the via portions 105-1b are in an oval or elliptical shape. In some embodiments, the cross-sections of the via portions 105-1b include various combinations of different shapes.

In some embodiments, the cross-section of each via portion 105-1b is in an oval or elliptical shape, while the cross-section of the corresponding conductive member 103 is in a circular shape. In some embodiments as shown in FIGS. 2M-2Q, each of the via portions 105-1b includes an axis 105-1c along its longest length and passing through its center, 105-1d. In some embodiments, all axes 105-1c of the via portions 105-1b are parallel to each other. In some embodiments, each of the via portions 105-1b is oriented in a predetermined direction. In some embodiments, as shown in FIGS. 2K-2Q, each of the axes 105-1c is disposed pointing towards a predetermined direction. In some embodiments, the axis 105-1c is inclined or tilted in an angle relative to a horizontal or vertical line. In some embodiments, the cross-sections of the via portions 105-1b are in a specific pattern as shown in any one of FIGS. 2M-2Q. In some embodiments, the via portions 105-1b are randomly arranged.

Figure 3:
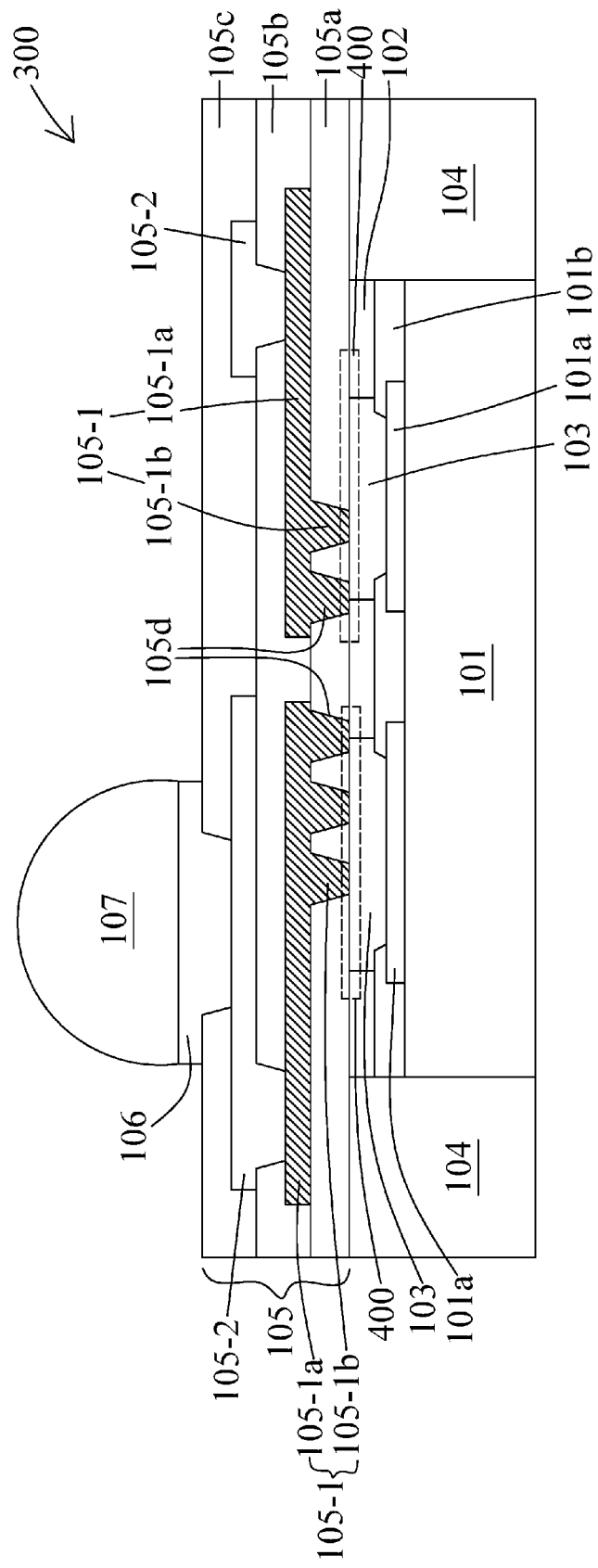
FIG. 3 is a schematic cross-sectional view of a semiconductor structure in accordance with some embodiments of the present disclosure.
Figure 4A:
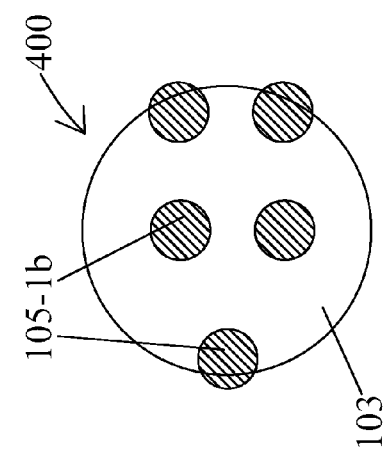
FIGS. 4A-4F are enlarged top views of a part 400 of a semiconductor structure of FIG. 3 with via portions of a first interconnect structure in various shapes, patterns or dimensions in accordance with some embodiments of the present disclosure.
Figure 4B:
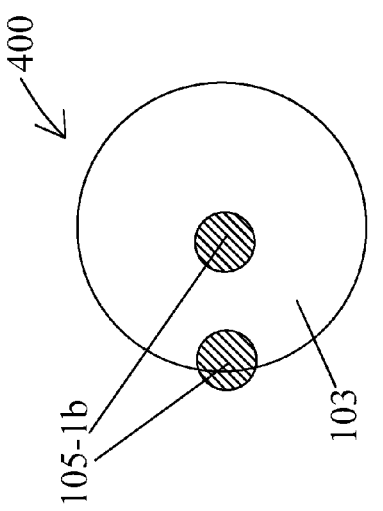
Figure 4C:
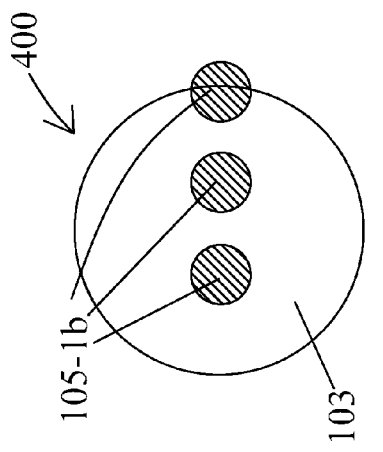
Figure 4D:
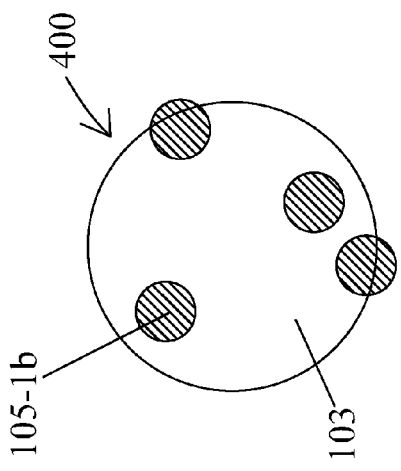
Figure 4E:
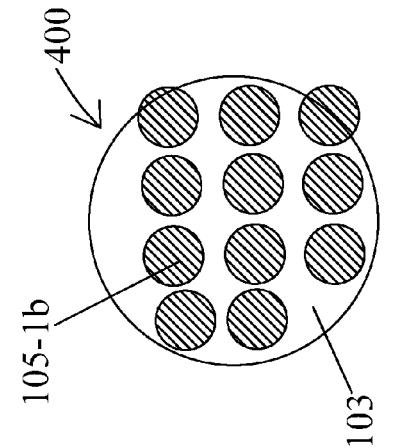
Figure 4F:
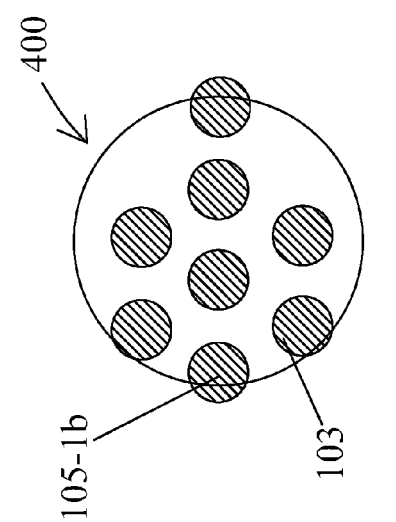

FIG. 3 is a schematic cross-sectional view of a semiconductor structure 300 in accordance with various embodiments of the present disclosure. In some embodiments, the semiconductor structure 300 includes a die 101, a die pad 101a, a conductive member 103, a molding 104 and a redistribution layer (RDL) 105, which have similar configurations as described above and illustrated in FIG. 1.

In some embodiments, the semiconductor structure 300 includes several via portions 105-1b which have a similar configuration as described above or illustrated in FIG. 1. In some embodiments, each of the via portions at least partially contacts with the conductive member 103. In some embodiments, a portion of one of the via portions 105-1b is not contacted with the conductive member 103. In some embodiments, one of the via portions 105-1b is not contacted with the conductive member 103, while another of the via portions 105-1b is at least partially contacted with the conductive member 103.

FIGS. 4A-4F illustrate schematic enlarged top views of a part 400 of the semiconductor structure 300 in FIG. 3. FIGS. 4A-4F show cross-sections of the via portions 105-1b of the first interconnect structure 105-1 and the corresponding conductive member 103 in a part 400 of FIG. 3. In some embodiments, a portion of one of the via portions 105-1b is not contacted with the corresponding conductive member 103 as illustrated in any one of FIGS. 4A-4F. In some embodiments, some of the via portions 105-1b are not contacted with the corresponding conductive member 103. In some embodiments, the portion of one of the via portions 105-1b or some of the via portions 105-1b is/are disposed on the first dielectric layer 102. In some embodiments, the portion of one of the via portions 105-1b or some of the via portions 105-1b is/are disposed outside the cross-section of the conductive member 103 contacting with the rest of the via portions 105-1b.

Since the first interconnect structure 105-1 configures with several via portions 105-1b disposed on the conductive member 103, the first interconnect structure 105-1 can still electrically connect with the conductive member 103 although a portion of one of the via portions 105-1b or some of the via portions 105-1b is/are not contacted with the conductive member 103. As such, the first interconnect structure 105-1 including several via portions 105-1b can avoid cold joint between the first interconnect structure 105-1 and the conductive member 103. The electrical connection between the first interconnect structure 105-1 and the conductive member 103 is improved.

Figure 5:
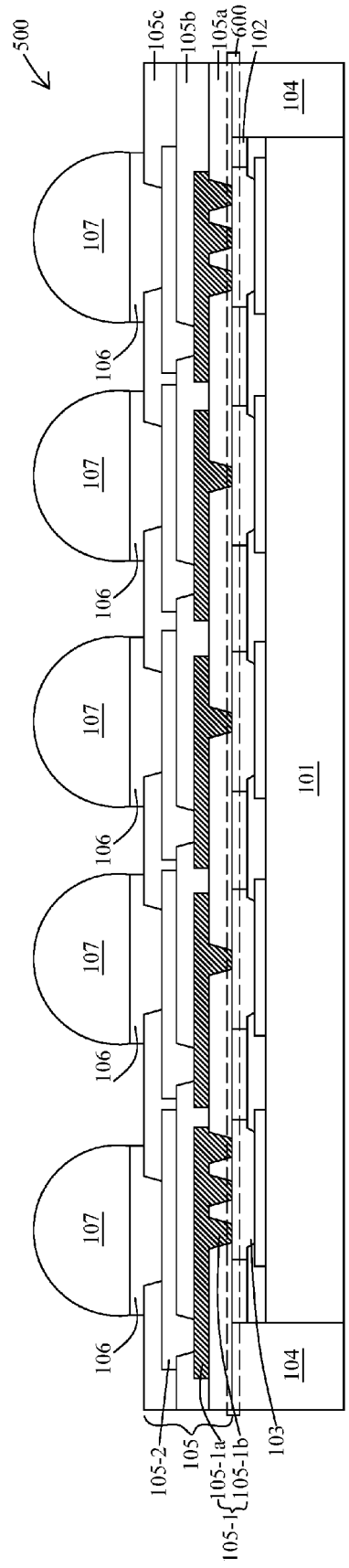
FIG. 5 is a schematic cross-sectional view of a semiconductor structure in accordance with some embodiments of the present disclosure.

FIG. 5 is a schematic cross-sectional view of a semiconductor structure 500 in accordance with various embodiments of the present disclosure. In some embodiments, the semiconductor structure 500 includes a die 101, several die pads 101a, several conductive members 103, a molding 104 and a redistribution layer (RDL) 105, which have similar configurations as described above and illustrated in FIG. 1 or 3. FIGS. 6A and 6B illustrate schematic enlarged top views of a part 600 of the semiconductor structure 500 in FIG. 5. FIGS. 6A and 6B show cross-sections of the via portions 105-1b of the first interconnect structure 105-1 and a cross-section of the corresponding conductive members 103 contacting with the via portions 105-1b in the part 600 of FIG. 5. In some embodiments, the conductive members 103 are arranged in a regular array over the die 101.

In some embodiments, as shown in FIGS. 6A and 6B, at least one via portion 105-1b is disposed on one of the conductive members 103. In some embodiments, several via portions 105-1b are disposed on one of the conductive members 103. In some embodiments, several via portions 105-1b are disposed on one of the conductive members 103, which is at a corner of the semiconductor structure 500. The via portions 105-1b disposed on the conductive member 103, which is at the corner of the semiconductor structure 500, can reduce internal stress of the semiconductor structure 500. In some embodiments, the via portions 105-1b on the conductive member 103, which is at the corner of the semiconductor structure 500, can be in a predetermined pattern. In some embodiments, the via portions 105-1b disposed on the conductive member 103, which is at the corner of the semiconductor structure 500, can be arranged in various patterns, for example as illustrated in any one of FIGS. 2A-2R and 4A-4F.

Figure 7:
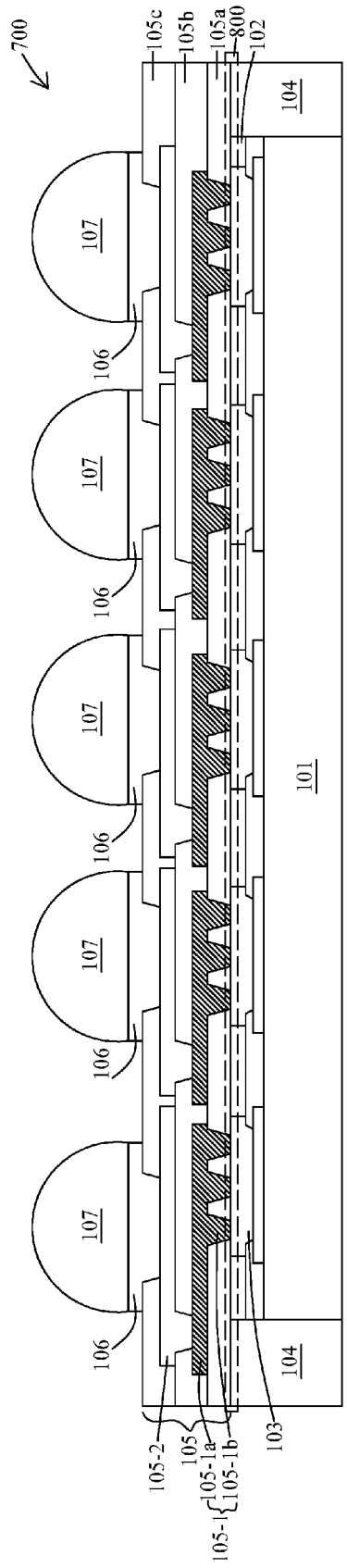
FIG. 7 is a schematic cross-sectional view of a semiconductor structure in accordance with some embodiments of the present disclosure.

FIG. 7 is a schematic cross-sectional view of a semiconductor structure 700 in accordance with various embodiments of the present disclosure. In some embodiments, the semiconductor structure 700 includes a die 101, several die pads 101a, several conductive members 103, a molding 104 and a redistribution layer (RDL) 105, which have similar configurations as described above and illustrated in any one of FIGS. 1, 3 and 5. FIGS. 8A-8E illustrate schematic enlarged top views of a part 800 of the semiconductor structure 700 in FIG. 7. FIGS. 8A-8E show cross-sections of the via portions 105-1b of the first interconnect structure 105-1 and a cross-section of the corresponding conductive members 103 in the part 800 of FIG. 7.

Figure 8B:
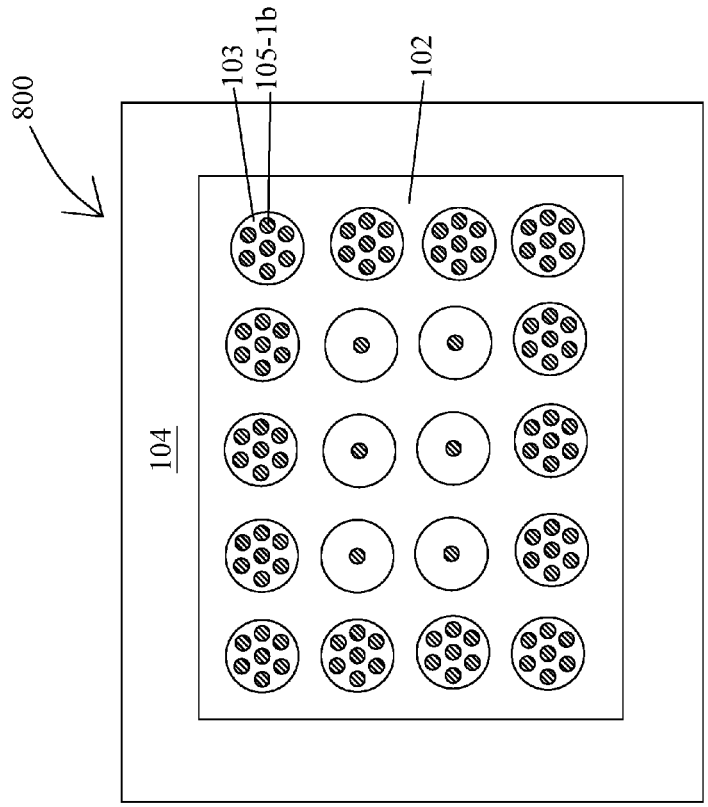
FIGS. 8A-8H are enlarged top views of a part 800 of a semiconductor structure of FIG. 7 with via portions of a first interconnect structure in various shapes, patterns or dimensions in accordance with some embodiments of the present disclosure.
Figure 8A:
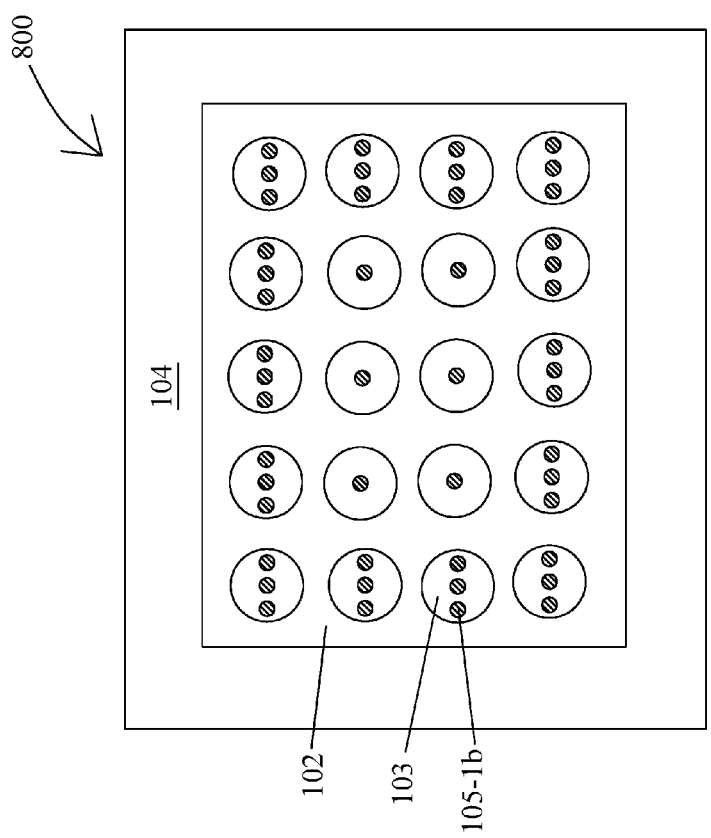

In some embodiments as shown in FIGS. 8A and 8B, several via portions 105-1b are disposed on one of the conductive members 103 which is adjacent to an edge of the semiconductor structure 700. The via portions 105-1b disposed on the conductive members 103 adjacent to the edge of the semiconductor structure 700 can reduce the internal stress of the semiconductor structure 700. In some embodiments, the via portions 105-1b on the conductive member 103 adjacent to the edge of the semiconductor structure 700 can be in a predetermined pattern. In some embodiments, the via portions 105-1b disposed on the conductive member 103 adjacent to the edge can be arranged in various patterns, for example as illustrated in any one of FIGS. 2A-2R and 4A-4F.

Figure 8D:
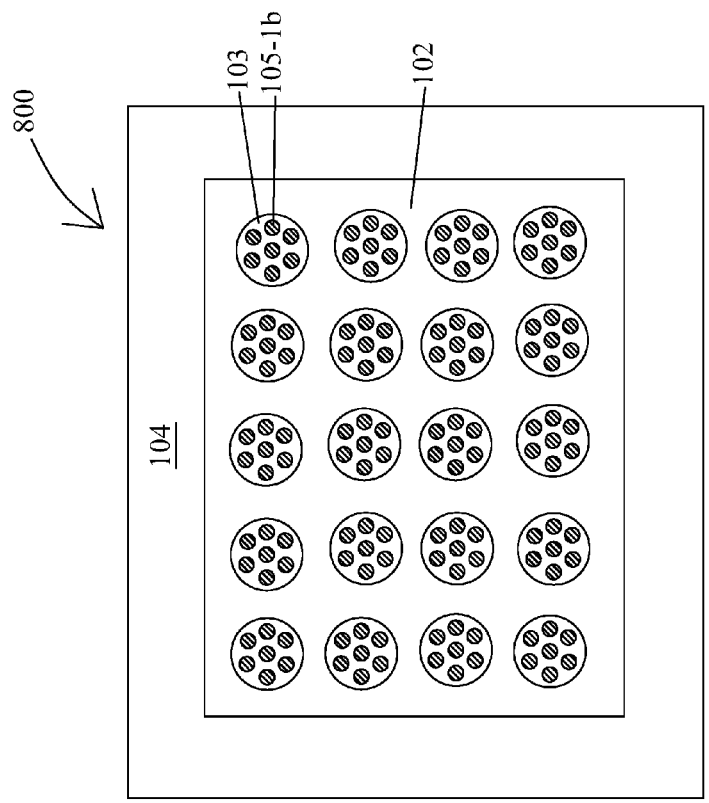
Figure 8C:
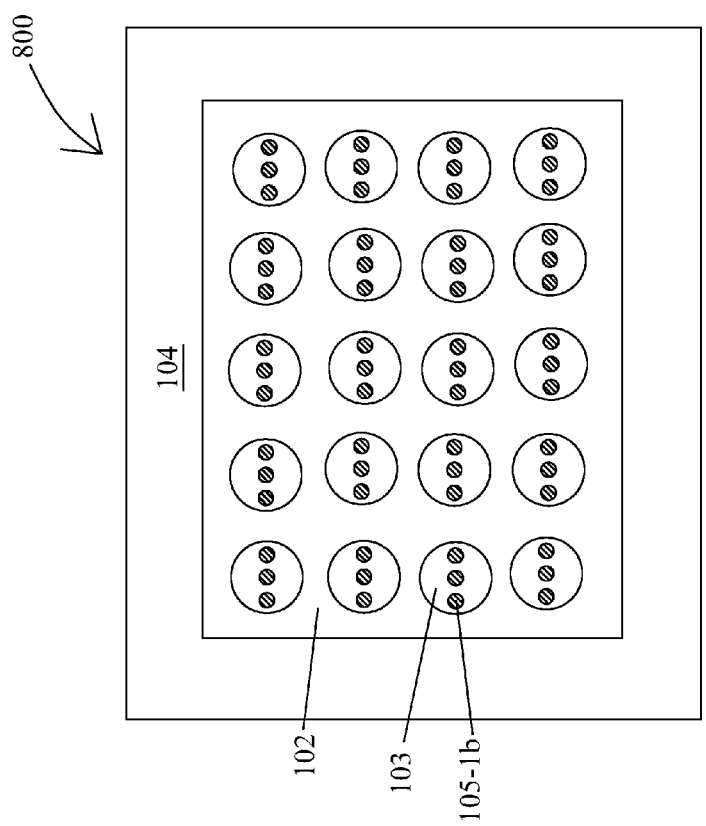
Figure 8E:
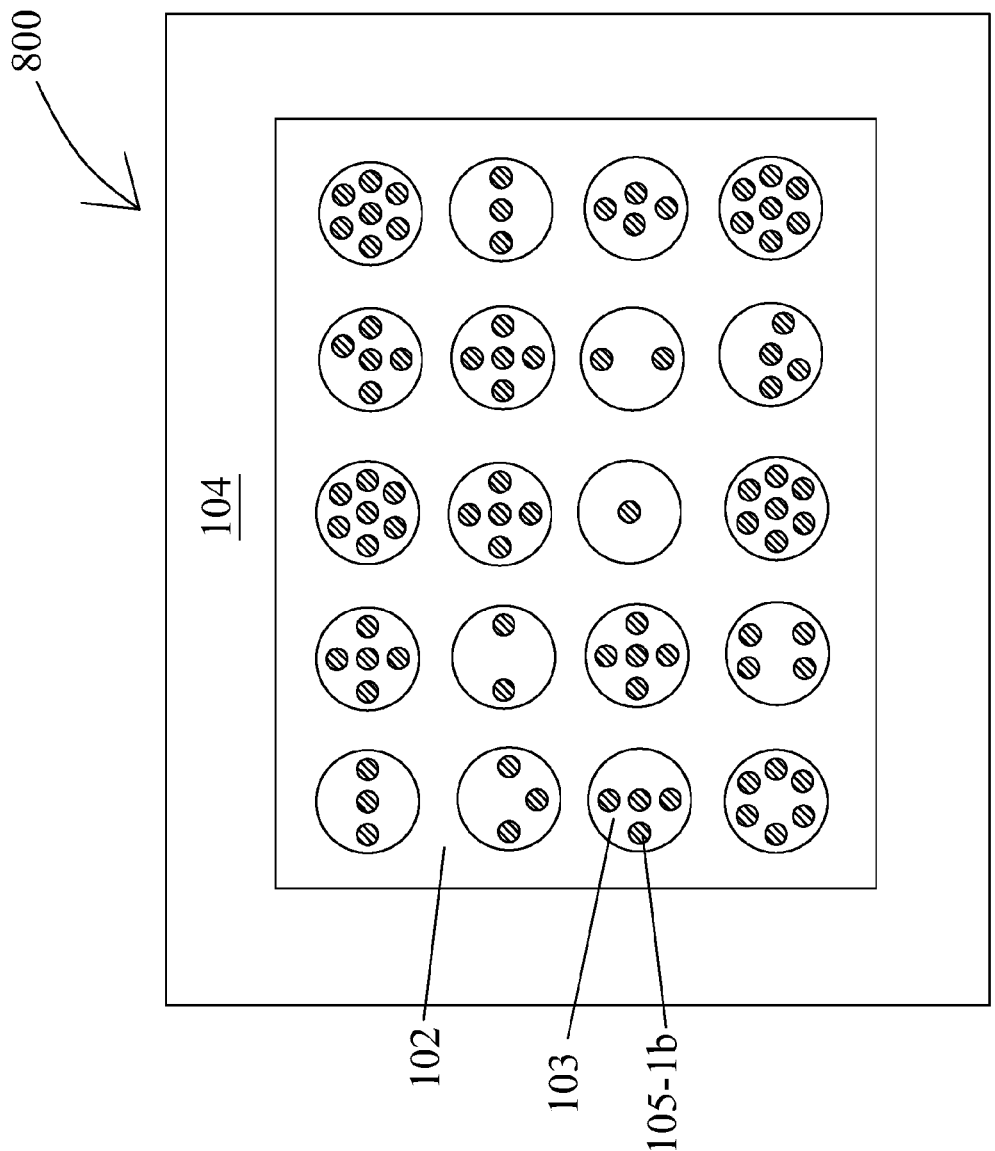

In some embodiments as shown in FIGS. 8C-8E, several via portions 105-1b are disposed on all of the conductive members 103 correspondingly. The via portions 105-1b disposed on all of the conductive members 103 can reduce the internal stress of the semiconductor structure 700. In some embodiments, the via portions 105-1b on the corresponding conductive member 103 can be in a predetermined pattern. In some embodiments, the via portions 105-1b disposed on the conductive member 103 can be arranged in various patterns, for example as illustrated in any one of FIGS. 2A-2R and 4A-4F.

Figure 8G:
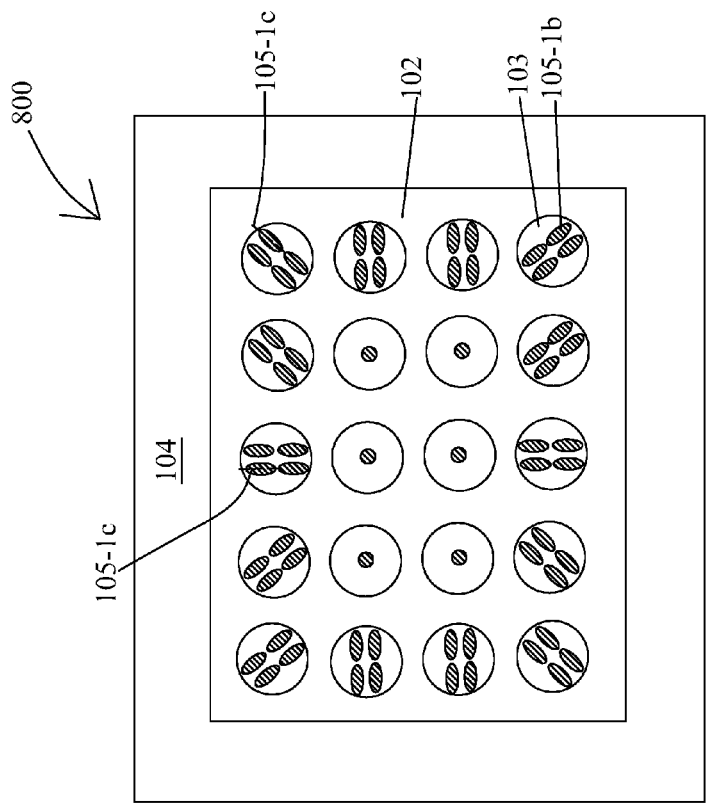
Figure 8F:
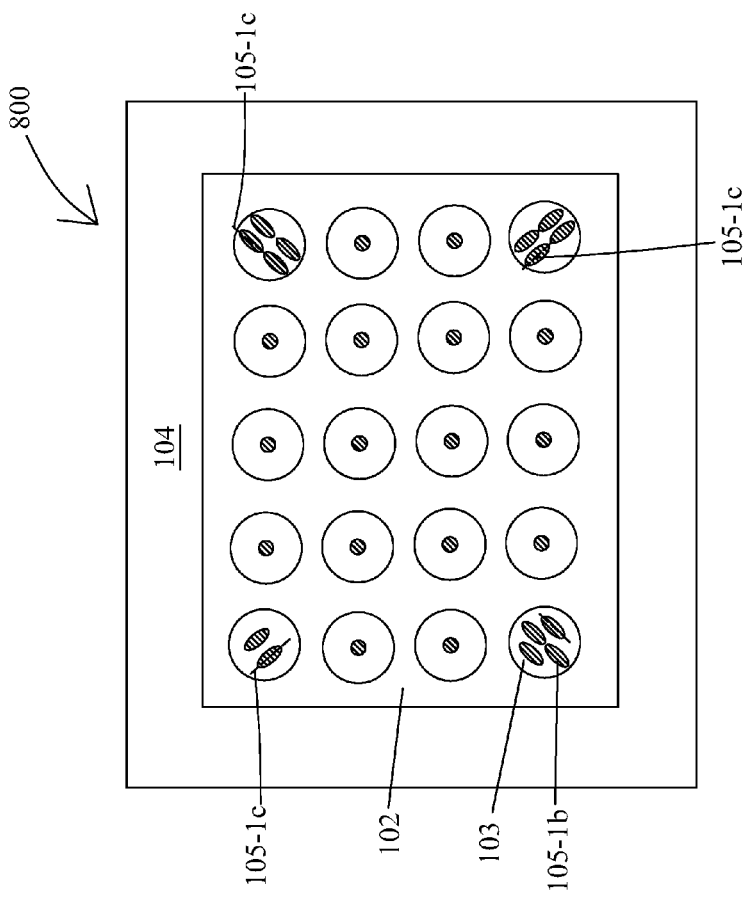
Figure 8H:
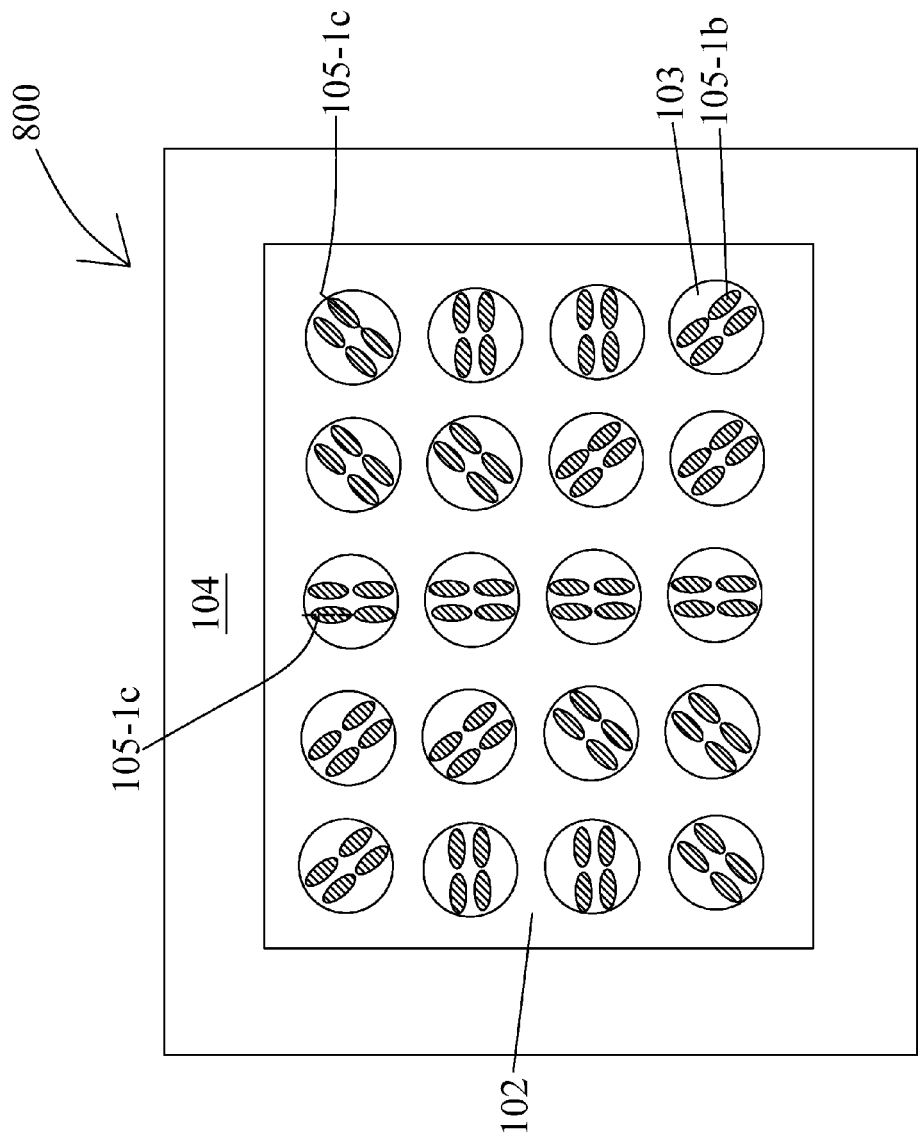

In some embodiments, the via portions 105-1b on the corresponding conductive member 103 are in various shapes or dimensions. In some embodiments as shown in FIGS. 8F-8G, some of the via portions 105-1b are in an oval or elliptical shape. In some embodiments as shown in FIG. 8H, all of the via portions 105-1b are in an oval or elliptical shape. The via portions 105-1b in an oval or elliptical shape can reduce the internal stress of the semiconductor structure 800. In some embodiments as shown in FIG. 8F, the via portions 105-1b disposed on the conductive members 103, which is at the corner of the semiconductor structure 800, are in an oval or elliptical shape. In some embodiments as shown in FIG. 8G, the via portions 105-1b disposed on the conductive members 103 adjacent to the edge of the semiconductor structure 800 are in an oval or elliptical shape. In some embodiments as shown in FIG. 8H, all of the via portions 105-1b are in an oval or elliptical shape.

In some embodiments, each of the via portions 105-1b in an oval or elliptical shape includes an axis 105-1c along its longest length and pointing towards a predetermined direction. In some embodiments as shown in FIGS. 8F-8H, all axes 105-1c are pointed towards a center or a central portion of the semiconductor structure 800. Such configuration can reduce the internal stress of the semiconductor structure 800. In some embodiments as shown in FIG. 8F, the via portions 105-1b are oriented such that the axes 105-1c of the via portions 105-1b disposed on the conductive members 103, which is at the corner of the semiconductor structure 800, are pointed towards the center of the semiconductor structure 800. In some embodiments as shown in FIG. 8G, the axes 105-1c of the via portions 105-1b disposed on the conductive members 103 at the edge are pointed towards the center of the semiconductor structure 800. In some embodiments, as shown in FIG. 8H, the axes 105-1c of all of the via portions 105-1b are pointed towards the center of the semiconductor structure 800.

Figure 9:
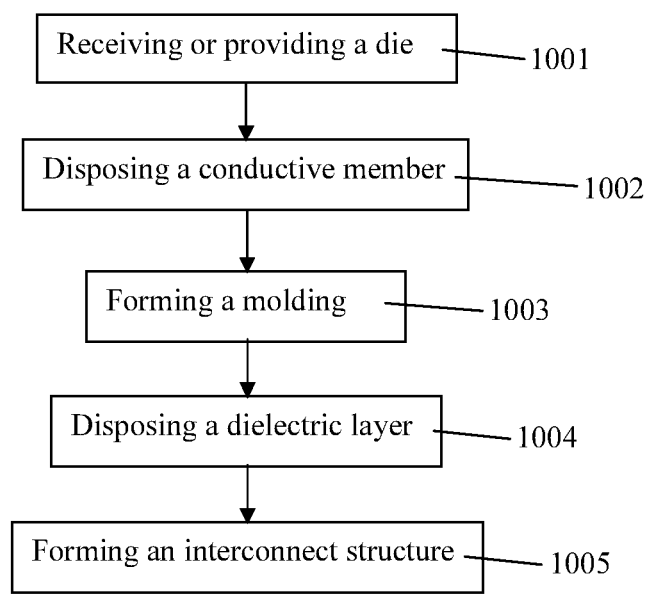
FIG. 9 is a flow diagram of a method of manufacturing a semiconductor structure in accordance with some embodiments of the present disclosure.

In the present disclosure, a method of manufacturing a semiconductor structure (100, 300, 500 or 700) is also disclosed. In some embodiments, a semiconductor structure (100, 300, 500 or 700) is formed by a method 1000. The method 1000 includes a number of operations and the description and illustration are not deemed as a limitation as the sequence of the operations. FIG. 9 is an embodiment of a method 1000 of manufacturing a semiconductor structure (100, 300, 500 or 700). The method 1000 includes a number of operations (1001, 1002, 1003, 1004 and 1005).

In operation 1001, a die 101 is received or provided as shown in FIG. 10A. In some embodiments, the die 101 is disposed over a substrate 901. In some embodiments, the die 101 includes a die pad 101a disposed over or within the die 101. In some embodiments, the die pad 101a is partially covered by a passivation 101b. In some embodiments, the die 101, the die pad 101a and the passivation 101b have similar configuration as described above or illustrated in any one of FIGS. 1, 3, 5 and 7. In some embodiments, the passivation 101b is disposed over the die 101 by any suitable operations, such as spin coating or the like. In some embodiments, the passivation 101b is patterned by any suitable operations, such as lithography and etching operations, to remove some portions of the passivation 101b and expose a portion of the die pad 101a.

In some embodiments, the substrate 901 is a carrier substrate for temporarily supporting the die 101 and other components subsequently disposed thereon. In some embodiments, the substrate 901 is a wafer. In some embodiments, the substrate 901 includes silicon, glass, ceramic or the like. In some embodiments, the die 101 is temporarily attached to the substrate 901 by an adhesive such as glue, tape, etc.

In operation 1002, a conductive member 103 is disposed over the die pad 101a of the die 101 as shown in FIG. 10B. In some embodiments, the conductive member 103 is formed over the die pad 101a and surrounded by a first dielectric layer 102. In some embodiments, the first dielectric layer 102 is disposed over the passivation 101b and is patterned by any suitable operations, such as lithography and etching operations, to remove some portions of the first dielectric layer 102 and expose the portion of the die pad 101a. In some embodiments, conductive material is disposed over the exposed portion of the die pad 101a and within the first dielectric layer 102 to form the conductive member 103. In some embodiments, the conductive member 103 is formed by any suitable operations, such as electroplating, sputtering, or the like. In some embodiments, the conductive member 103 has a similar configuration as described above or illustrated in any one of FIGS. 1, 3, 5 and 7.

Figure 10C:
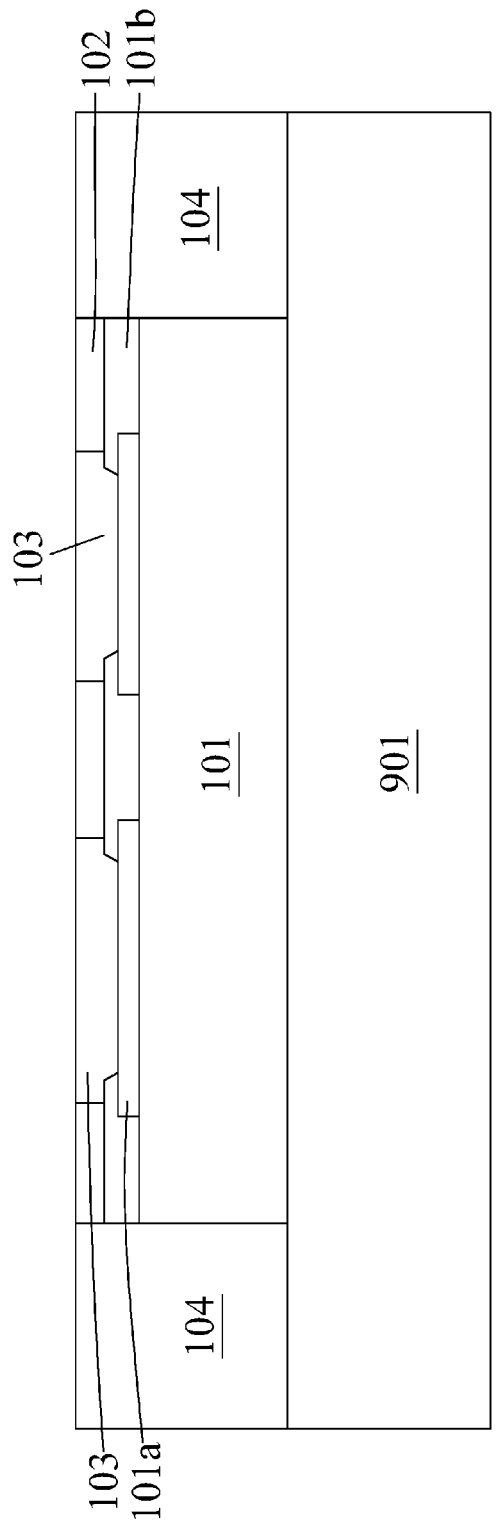
Figure 10D:
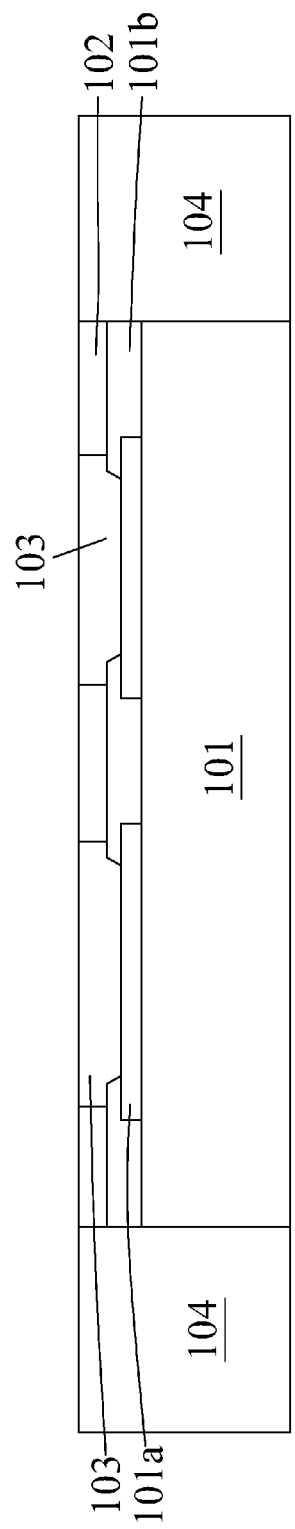

In operation 1003, a molding 104 is formed as shown in FIGS. 10C and 10D. In some embodiments, the molding 104 is disposed over the substrate 901 and around the die 101, the first dielectric layer 102 and the conductive member 103. In some embodiments, the molding 102 is formed by disposing a molding material over the substrate 901, the first dielectric layer 102 and the conductive member 103. Then the molding material is grinded to thin down the molding material until the conductive member 103 is exposed. In some embodiments, the molding 104 has a similar configuration as described above or illustrated in any one of FIGS. 1, 3, 5 and 7. In some embodiments, the substrate 901 is detached and removed after the formation of the molding 104 as shown in FIG. 10D.

Figure 10E:
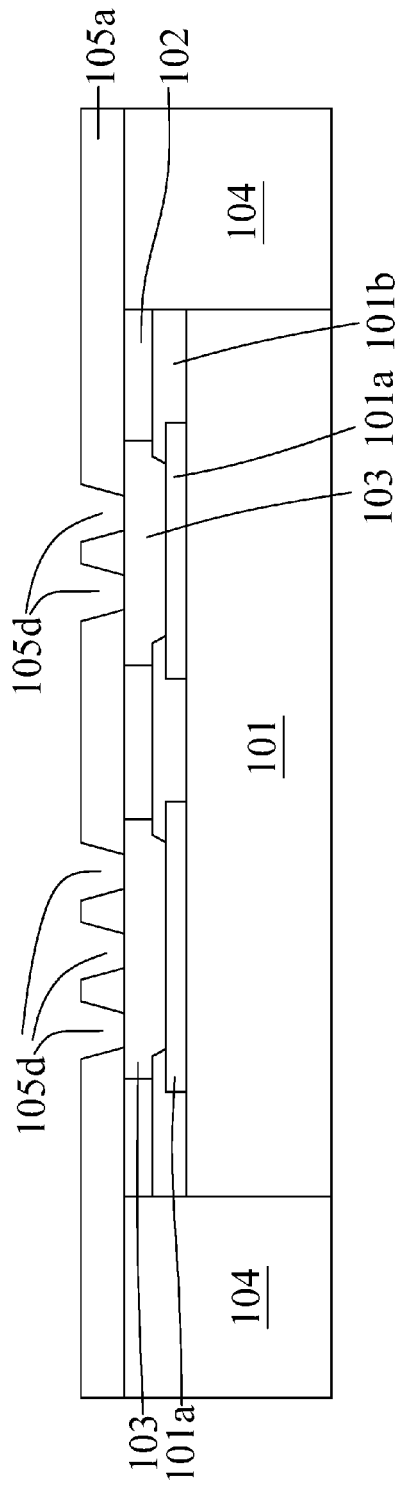

In operation 1004, a second dielectric layer 105a is disposed over the molding 104, the first dielectric layer 102 and the conductive member 103 as shown in FIG. 10E. In some embodiments, the disposition of the second dielectric layer 105a is a part of the operations of forming a redistribution layer (RDL) over the die 101 and the molding 104. In some embodiments, the second dielectric layer 105a is disposed by any suitable operations such as spin coating, chemical vapor deposition (CVD), etc. In some embodiments, the second dielectric layer 105a is patterned by any suitable operations, such as lithography and etching operations, to remove some portions of the second dielectric layer 105a and expose a portion of the conductive member 103. In some embodiments, the second dielectric layer 105a is patterned to form several recesses 105d over the conductive member 103. In some embodiments, the recesses 105d are extended through the second dielectric layer 105a towards the conductive member 103. In some embodiments, the second dielectric layer 105a has a similar configuration as described above or illustrated in any one of FIGS. 1, 3, 5 and 7.

Figure 10F:
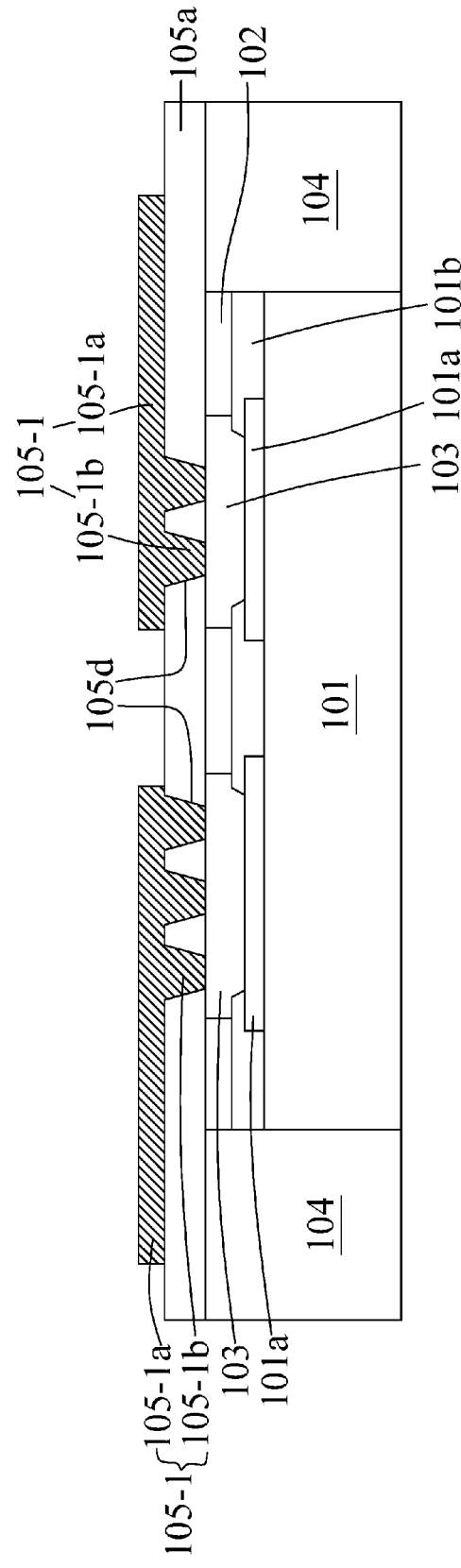

In operation 1005, a first interconnect structure 105-1 is formed as shown in FIG. 10F. In some embodiments, the first interconnect structure 105-1 is formed by disposing a conductive material over the second dielectric layer 105a and within the recesses 105d. In some embodiments, the first interconnect structure 105-1 is disposed by electroplating or other suitable operations. In some embodiments, the formation of the first interconnect structure 105-1 is a part of the operations of forming the RDL. In some embodiments, the first interconnect structure 105-1 has a similar configuration as described above or illustrated in any one of FIGS. 1, 3, 5 and 7.

In some embodiments, the first interconnect structure 105-1 includes a land portion 105-1a and several via portions 105-1b. In some embodiments, the land portion 105-1a is disposed along the second dielectric layer 105a, and the via portions 105-1b are disposed within the recesses 105d. In some embodiments, the via portions 105-1b are electrically connected with and protruded from the land portion 105-1a. In some embodiments, the first interconnect structure 105-1a is electrically connected with the conductive member 103 by the via portions 105-1b. In some embodiments, each of the via portions 105-1b at least partially contacts with the conductive member 103.

In some embodiments, the via portions 105-1b are formed in a predetermined pattern as described above and illustrated in any one of FIGS. 2A-2R, 4A-4F, 6A, 6B and 8A-8H. In some embodiments, a cross-section of the via portion 105-1b contacting with the conductive member 103 is in a predetermined shape as described above and illustrated in any one of FIGS. 2A-2R, 4A-4F, 6A, 6B and 8A-8H. In some embodiments, the cross-section of the via portion 105-1b is in a circular, oval or elliptical shape.

Figure 10G:
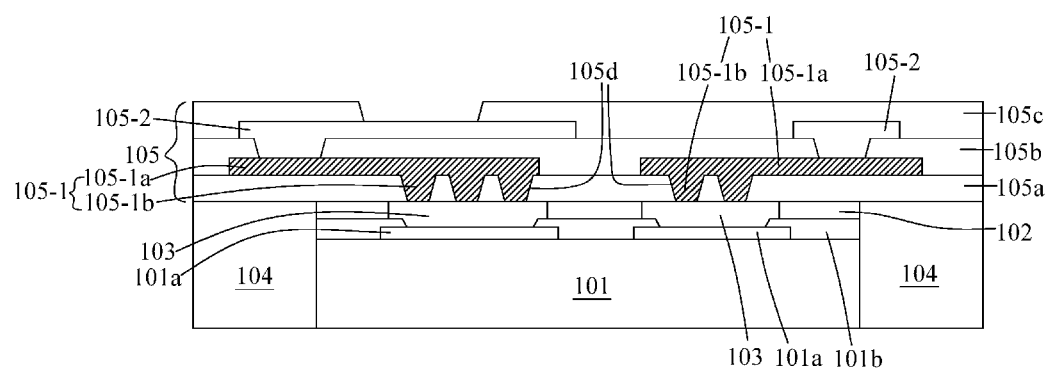

In some embodiments, a third dielectric layer 105b is disposed over the first interconnect structure 105-1 and the second dielectric layer 105a as shown in FIG. 10G. In some embodiments, the disposition of the third dielectric layer 105b is a part of the operations of forming the RDL. In some embodiments, the third dielectric layer 105b is disposed by any suitable operations such as spin coating, chemical vapor deposition (CVD), etc. In some embodiments, the third dielectric layer 105b is patterned by any suitable operations, such as lithography and etching operations, to remove some portions of the third dielectric layer 105b and expose a portion of the first interconnect structure 105-1. In some embodiments, the third dielectric layer 105b has a similar configuration as described above or illustrated in any one of FIGS. 1, 3, 5 and 7.

In some embodiments, a second interconnect structure 105-2 is disposed over and within the third dielectric layer 105b as shown in FIG. 10G. In some embodiments, the second interconnect structure 105-2 is electrically connected with the first interconnect structure 105-1 through the land portion 105-1a. In some embodiments, the via portions 105-1b are overlaid by at least a portion of the second interconnect structure 105-2. In some embodiments, the second interconnect structure 105-2 is disposed by electroplating or other suitable operations. In some embodiments, the formation of the second interconnect structure 105-2 is a part of the operations of forming the RDL. In some embodiments, the second interconnect structure 105-2 has a similar configuration as described above or illustrated in any one of FIGS. 1, 3, 5 and 7.

In some embodiments, a fourth dielectric layer 105c is disposed over the second interconnect structure 105-2 and the third dielectric layer 105b as shown in FIG. 10G. In some embodiments, the disposition of the fourth dielectric layer 105c is a part of the operations of forming the RDL. In some embodiments, the fourth dielectric layer 105c is disposed by any suitable operations such as spin coating, chemical vapor deposition (CVD), etc. In some embodiments, the fourth dielectric layer 105c is patterned by any suitable operations, such as lithography and etching operations, to remove some portions of the fourth dielectric layer 105c and expose a portion of the second interconnect structure 105-2. In some embodiments, the fourth dielectric layer 105c has a similar configuration as described above or illustrated in any one of FIGS. 1, 3, 5 and 7.

Figure 10H:
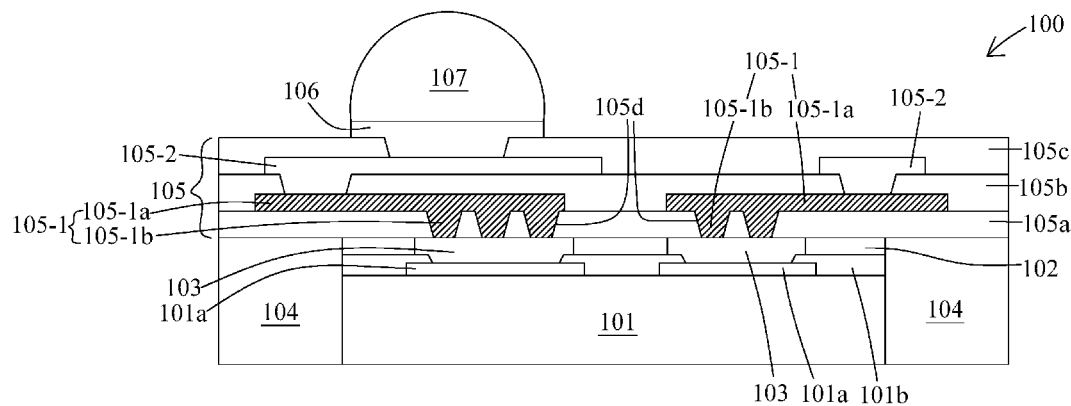

In some embodiments, a conductive pad 106 is disposed over the second interconnect structure 105-2 as shown in FIG. 10H. In some embodiments, the conductive pad 106 is electrically connected with the second interconnect structure 105-2. In some embodiments, the conductive pad 106 is formed by any suitable operations such as sputtering, electroplating, etc. In some embodiments, the conductive pad 106 is a UBM pad configured to receive a conductive structure. In some embodiments, the conductive pad 106 has a similar configuration as described above or illustrated in any one of FIGS. 1, 3, 5 and 7.

In some embodiments, a conductive bump 107 is disposed over the conductive pad 106 as shown in FIG. 10H. In some embodiments, the conductive bump 107 is disposed over the conductive pad 106 by ball dropping, solder pasting, stencil printing or other suitable operations. In some embodiments, the conductive bump 107 undergoes thermal or reflowing operations after disposing over the conductive pad 106. In some embodiments, the conductive bump 107 has a similar configuration as described above or illustrated in any one of FIGS. 1, 3, 5 and 7.

In some embodiments, the substrate 901 is detached or removed after disposing the conductive bump 107. In some embodiments, a semiconductor structure 100 is formed. The semiconductor structure 100 has a similar configuration as the semiconductor structure (100, 300, 500 or 700) described above or illustrated in any one of FIGS. 1, 3, 5 and 7. In some embodiments, the conductive bump 107 bonds with another substrate in order to electrically connect the die 101 with another substrate.

In the present disclosure, a semiconductor structure with improvement is disclosed. The semiconductor structure includes an interconnect structure electrically connected with a conductive member disposed over a die. The interconnect structure includes several via portions contacting with the conductive member. Such configuration of the interconnect structure can increase contact surface area between the interconnect structure and the conductive member, and thus can improve their electrical connection and minimize or prevent delamination of the interconnect structure from the conductive member.

In some embodiments, a semiconductor structure includes a die including a die pad disposed over the die; a conductive member disposed over and electrically connected with the die pad; a molding surrounding the die and the conductive member; and a redistribution layer (RDL) disposed over the molding, the conductive member and the die, the RDL includes a dielectric layer and an interconnect structure. The interconnect structure includes a land portion and a plurality of via portions, the land portion is disposed over the dielectric layer, the plurality of via portions are protruded from the land portion to the conductive member through the dielectric layer, and each of the plurality of via portions at least partially contacts with the conductive member.

In some embodiments, the plurality of via portions are randomly arranged over the conductive member, or are arranged in a predetermined pattern or a regular array over the conductive member. In some embodiments, a surface of one of the plurality of via portions contacting with the conductive member has a substantially different shape from a surface of another one of the plurality of via portions contacting with the conductive member. In some embodiments, a surface of one of the plurality of via portions contacting with the conductive member is in an oval or elliptical shape, and a surface of another one of the plurality of via portions contacting with the conductive member is in a circular shape. In some embodiments, a surface of one of the plurality of via portions contacting with the conductive member includes an axis along the surface, and the axis is pointed towards a center or a central portion of the semiconductor structure. In some embodiments, one of the plurality of via portions partially contacts with the conductive member. In some embodiments, one of the plurality of via portions is not contacted with the conductive member, and another one of the plurality of via portions is at least partially contacted with the conductive member. In some embodiments, the RDL further includes a second interconnect structure electrically connected with the interconnect structure and at least partially overlying the plurality of via portions of the interconnect structure. In some embodiments, a ratio of a total surface area of the plurality of via portions contacting with the conductive member to a surface area of the conductive member contacting with the plurality of the via portions is substantially greater than about 1:40. In some embodiments, a surface of one of the plurality of via portions contacting with the conductive member has a width of about 10 um, and a surface of the conductive member contacting the plurality of via portions has a width of about 90 um. In some embodiments, a number of the plurality of via portions is from about 2 to about 20. In some embodiments, the conductive member and the interconnect structure include copper. In some embodiments, the semiconductor structure further includes a conductive pad disposed over the RDL and configured to receive a conductive bump.

In some embodiments, a semiconductor structure includes a die including a plurality of die pads disposed over the die, a plurality of conductive members disposed over and electrically connected with the plurality of die pads correspondingly, a molding surrounding the die and the plurality of conductive members, and a redistribution layer (RDL) disposed over the molding, the plurality of conductive members and the die, and including a dielectric layer and a plurality of interconnect structures, wherein each of the plurality of interconnect structures includes a land portion and a plurality of via portions, the land portion is elongated over the dielectric layer, and the plurality of via portions are protruded from the land portion, are passed through the dielectric layer, and are contacted with a corresponding one of the plurality of conductive members.

In some embodiments, the plurality of via portions contacting with one of the plurality of conductive members are arranged in a predetermined pattern which is the same as or different from the plurality of via portions contacting with another one of the plurality of conductive members. In some embodiments, the plurality of conductive members are arranged in a regular array. In some embodiments, the plurality of via portions are disposed within a surface of the corresponding one of the plurality of conductive members.

In some embodiments, a method of manufacturing a semiconductor structure includes providing a die including a die pad disposed over the die; disposing a conductive member over the die pad of the die; forming a molding surrounding the die and the conductive member; disposing a dielectric layer over the molding, the die and the conductive member; and forming an interconnect structure including a land portion and a plurality of via portions. The land portion is disposed over the dielectric layer, the plurality of via portions are disposed over the conductive member and protruded from the land portion to the conductive member through the dielectric layer, and each of the plurality of via portions at least partially contacts with the conductive member.

In some embodiments, the forming the interconnect structure includes disposing a conductive material into a plurality of recesses extending through the dielectric layer towards the conductive member to form the plurality of via portions. In some embodiments, the disposing of the dielectric layer includes patterning the dielectric layer by removing some portions of the dielectric layer over the conductive member to form a plurality of recesses extending through the dielectric layer towards the conductive member.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a die including a die pad disposed over the die;
   a conductive member disposed over and electrically connected with the die pad;
   a molding surrounding the die and the conductive member; and
   a redistribution layer (RDL) disposed over the molding, the conductive member and the die, and including a dielectric layer and an interconnect structure, wherein the interconnect structure includes a land portion and a plurality of via portions, the land portion is disposed over the dielectric layer, the plurality of via portions protrude from the land portion to the conductive member through the dielectric layer, each of the plurality of via portions at least partially contacts the conductive member, and a ratio of a total surface area of the plurality of via portions contacting with the conductive member to a surface area of the conductive member contacting with the plurality of the via portions is substantially greater than about 1:40.

2. The semiconductor structure of claim 1, wherein the plurality of via portions are randomly arranged over the conductive member, or are arranged in a predetermined pattern or a regular array over the conductive member.

3. The semiconductor structure of claim 1, wherein a surface of one of the plurality of via portions contacting with the conductive member has a substantially different shape from a surface of another one of the plurality of via portions contacting with the conductive member.

4. The semiconductor structure of claim 1, wherein a surface of one of the plurality of via portions contacting with the conductive member is in an oval or elliptical shape, and a surface of another one of the plurality of via portions contacting with the conductive member is in a circular shape.

5. The semiconductor structure of claim 1, wherein a surface of one of the plurality of via portions contacting with the conductive member includes an axis along the surface, and the axis is pointed towards a center or a central portion of the semiconductor structure.

6. The semiconductor structure of claim 1, wherein one of the plurality of via portions partially contacts with the conductive member.

7. The semiconductor structure of claim 1, wherein one of the plurality of via portions is not contacted with the conductive member, and another one of the plurality of via portions is at least partially contacted with the conductive member.

8. The semiconductor structure of claim 1, wherein the RDL further includes a second interconnect structure electrically connected with the interconnect structure and at least partially overlying the plurality of via portions of the interconnect structure.

9. The semiconductor structure of claim 1, wherein the land portion is electrically connected to the die pad or the conductive member through the plurality of via portions.

10. The semiconductor structure of claim 1, wherein a surface of one of the plurality of via portions contacting with the conductive member has a width of about 10 um, and a surface of the conductive member contacting the plurality of via portions has a width of about 90 um.

11. The semiconductor structure of claim 1, wherein a number of the plurality of via portions is from about 2 to about 20.

12. The semiconductor structure of claim 1, wherein the conductive member and the interconnect structure include copper.

13. The semiconductor structure of claim 1, further comprising a conductive pad disposed over the RDL and configured to receive a conductive bump.

14. A semiconductor structure, comprising:
a die including a first die pad and a second die pad disposed over the die;
a first conductive member disposed over and electrically connected to the first die pad;
a second conductive member disposed over and electrically connected to the second pad;
a molding surrounding the die and the first conductive member and the second conductive member; and
a redistribution layer (RDL) disposed over the molding, the first conductive member, the second conductive member and the die, and including a dielectric layer, a first interconnect structure and a second interconnect structure,
wherein the first interconnect structure includes a first land portion and a plurality of first via portions, the second interconnect structure includes a second land portion and a plurality of second via portions, the plurality of first via portions protrude from the first land portion, pass through the dielectric layer and contacted with the first conductive member, the plurality of second via portions protrude from the second land portion, pass through the dielectric layer and contacted with the second conductive member.

15. The semiconductor structure of claim 14, wherein the plurality of first via portions contacting with the first conductive member are arranged in a predetermined pattern which is the same as or different from the plurality of second via portions contacting with the second conductive member.

16. The semiconductor structure of claim 14, wherein the plurality of first via portions or the plurality of second via portions are arranged in a regular array.

17. The semiconductor structure of claim 14, wherein the plurality of first via portions are disposed within a surface of the first conductive member, or the plurality of second via portions are disposed within a surface of the second conductive member.

18. A semiconductor structure, comprising:
a die including a die pad;
a conductive pillar disposed over and electrically connected with the die pad;
a molding surrounding the die, the die pad and the conductive pillar; and
a redistribution layer (RDL) disposed over the molding and the conductive pillar, and including a dielectric layer and an interconnect structure,
wherein the dielectric layer is disposed over the conductive pillar and the molding, the interconnect structure includes a land portion and a plurality of via portions, the land portion is disposed over the dielectric layer, the plurality of via portions are protruded from the land portion to the conductive pillar through the dielectric layer and are in contact with the conductive pillar, and a portion of the dielectric layer is disposed between two of the plurality of via portions.

19. The semiconductor structure of claim 18, wherein the portion of the dielectric layer is surrounded by two of the plurality of via portions, the land portion and the conductive pillar.

20. The semiconductor structure of claim 18, wherein the portion of the dielectric layer is extended between the land portion and the conductive pillar.

* * * * *